United States Patent [19]

Ashiwake et al.

[11] Patent Number: 5,406,807
[45] Date of Patent: Apr. 18, 1995

[54] APPARATUS FOR COOLING SEMICONDUCTOR DEVICE AND COMPUTER HAVING THE SAME

[75] Inventors: Noriyuki Ashiwake, Tsuchiura; Tadakatsu Nakajima; Shigeyuki Sasaki, both of Ibaraki; Yasuo Ohsone; Toshio Hatada, both of Tsuchiura; Toshiki Iino, Ibaraki; Kenichi Kasai; Akio Idei, both of Hadano, all of Japan

[73] Assignee: Hitachi, Ltd., Japan

[21] Appl. No.: 77,109

[22] Filed: Jun. 16, 1993

[30] Foreign Application Priority Data

Jun. 17, 1992 [JP] Japan .................. 4-157787
Aug. 27, 1992 [JP] Japan .................. 4-228331

[51] Int. Cl.6 ............................................. F25D 17/02
[52] U.S. Cl. ................................... 62/376; 62/435; 361/699; 165/908
[58] Field of Search .............. 62/118, 434, 435, 376; 361/699; 165/908

[56] References Cited

U.S. PATENT DOCUMENTS

| | | | |
|---|---|---|---|
| 3,524,497 | 8/1967 | Chu et al. | 361/699 X |
| 3,586,101 | 6/1971 | Chu et al. | 165/101 |
| 4,302,793 | 11/1981 | Rohner | 361/699 |
| 4,590,538 | 5/1986 | Cray, Jr. | 361/385 |
| 4,619,316 | 10/1986 | Nakayama et al. | 361/699 X |
| 4,967,832 | 11/1990 | Porter | 62/434 X |
| 5,021,924 | 6/1991 | Kieda et al. | 361/699 |
| 5,239,443 | 8/1993 | Fahey et al. | 361/699 X |
| 5,249,100 | 9/1993 | Satoh et al. | 361/699 X |

FOREIGN PATENT DOCUMENTS

3-7960   3/1991  Japan .
4-113660 4/1992  Japan .

OTHER PUBLICATIONS

IBM Technical Disclosure Bulletin, vol. 20, No. 8, Jan. 1978, Diaphragm Cooling for Devices, by A. H. Johnson.

Primary Examiner—William E. Tapolcai
Attorney, Agent, or Firm—Evenson, McKeown, Edwards & Lenahan

[57] ABSTRACT

An apparatus for cooling semiconductor devices includes a module for cooling semiconductor devices; a refrigerant cooling device for receiving via an outlet pipe the refrigerant discharged through an outlet port of the module to cool the refrigerant; a refrigerant circulation pump for receiving, via a suction pipe, the refrigerant cooled by the refrigerant cooling device and sending the refrigerant to the module via an inlet pipe; and a refrigerant-flow stabilizing mechanism for stabilizing a refrigerant circulation flow discharged from the refrigerant circulation pump to be returned to the refrigerant circulation pump via the module and the refrigerant cooling device. Since the refrigerant-flow stabilizing mechanism stabilize the refrigerant flow, the refrigerant flow can be stably circulated so that the semiconductor devices in the module are stably cooled.

9 Claims, 19 Drawing Sheets

APPARATUS FOR COOLING SEMICONDUCTOR DEVICE AND COMPUTER HAVING THE SAME

FIELD OF INVENTION

The present invention relates to an apparatus for cooling semiconductor devices by using a cooling medium or refrigerant, a semiconductor apparatus having the same and a computer having them. More particularly, the present invention relates to an apparatus for cooling semiconductor devices which has modules for cooling semiconductor devices each module (hereafter referred to as "semiconductor devices-cooling module") including a container having an inflow Port for a refrigerant and an outflow port for the refrigerant and a board on which one or more semiconductor devices are so mounted that the semiconductor devices are dipped, in the container, in the refrigerant flowing from the inflow port for the refrigerant to the outflow port for the refrigerant and the semiconductor devices are cooled with the flow of the refrigerant. For example, the present invention is adaptable to cool a semiconductor device, such as VLSI (Very Large Scale Integration) chip, of a type which generates heat at a high density and whih is mounted on a board in the module for cooling semiconductor devices. For example, the present invention is adaptable to serve as an apparatus for cooling semiconductor devices for use in a very-large-scale general purpose computer or a supercomputer.

The term "heat generation density" in this specification is a value that is expressed by a unit of a heating value (for example, $W/cm^2$) per unit time and unit area of a semiconductor device such as an integrated circuit.

BACKGROUND ART

A method of directly dipping semiconductor devices in a fluid to cool them has been disclosed in, for example, U.S. Pat. No. 4,590,538. The foregoing conventional method provides an arrangement that logic modules, memory modules and a power supply module for several IP (Instruction Processor) boards, which are formed into a stack of printed circuit boards on each of which a multiplicity of semiconductor devices are mounted, are collectively dipped in a refrigerant in one refrigerant container, and the refrigerant fluid is circulated by a refrigerant circulation pump disposed outside the container so that the semiconductor devices are cooled.

In general, an apparatus for cooling semiconductors must have excellent cooling performance by utilizing the forced convection and boiling heat transfer to dip and cool very high heat generation density devices of about several 10 $W/cm^2$. In this case, the flow of the refrigerant that passes through a pipe connecting the semiconductor devices and the refrigerant cooling device is a so-called gas-liquid two-phase flow composed of bubbles and liquid which flow simultaneously. The gas-liquid two-phase flow sometimes encounters pulsations occurring in its void ratio, which is the volume ratio of bubbles, and in pressure loss in the fluid passage thereof even in a steady state thereof. Therefore, the two-phase flow is liable to become unstable. If a pressure change takes place in a system of pipes followed by propagation of the change to surfaces of the semiconductor devices, saturation temperature of the refrigerant at the surfaces of the devices changes in accordance with the pressure. Therefore, the refrigerant is brought into a non-boiled state, resulting sometimes in that a predetermined cooling performance cannot be obtained. Therefore, it is necessary to maintain hydrodynamic stability of the system in terms of securing stability of operation of the functional system, such as a computer or its logic modules.

However, the foregoing conventional technology seems to have been established without taking into consideration the problem of the stability of the two-phase flow necessarily occurring in the case where a portion of the refrigerant liquid boils while forming bubbles.

Since the technology disclosed in U.S. Pat. No. 4,590,538 has the arrangement that the modules for several IPs are collectively dipped in one refrigerant container, the refrigerant must be completely removed from the container whenever the module or the device is changed. Therefore, the maintenance work cannot easily be performed. When the maintenance work, after the refrigerant has been removed, is performed at a user site contamination substances, such as dust, is likely to be mixed into the container during the maintenance work. As a result, there is a fear that the contamination substances adversely affect the semiconductor devices. The foregoing fact raises a critical problem for a ultra-high-density module which is mounted in the form of bare chips and/or on a thin film circuit board.

A cooling apparatus of a type for circulating refrigerant fluid to each of modules for cooling semiconductor devices has been disclosed in U.S. Pat. No. 3,586,101. In this conventional technology, natural circulation force generated due to density difference occurring in the refrigerant fluid is used as a main drive force for circulating the refrigerant.

However, the structure mainly utilizing the natural circulation force generated due to the density difference in the refrigerant fluid as disclosed in U.S. Pat. No. 3,586,101 encounters a limitation present in a flow rate of the refrigerant that can be circulated. Therefore, recently used devices of a very high heat generation density of about several 10 $W/cm^2$ cannot be cooled in terms of practical effectivity. What is worse, the refrigerant is usually boiled in the case where the very high heat generation density device of the foregoing type is cooled. Therefore, the flow of the refrigerant is made to be a two-phase flow including bubbles and, accordingly, the flow is likely to be unstable. Accordingly, the hydrodynamic stability must be maintained to improve the stability of the operation of the system. However, the technology disclosed in U.S. Pat. No. 3,586,101 does not seem to take into consideration the foregoing problem about the stability of the two-phase flow.

The technology disclosed in U.S. Pat. No. 3,586,101 having the arrangement, where the refrigerant fluid is circulated through each semiconductor devices-cooling module, has no special consideration about method of the maintenance work. Therefore, a similar problem occurs to that experienced with the technology disclosed in U.S. Pat. No. 4,590,538.

Japanese Utility Model Examined Publication No. 3-7960 has disclosed a structure in which a refrigerant is forcibly circulated to be sprayed to the heat generating devices (semiconductor devices) in a semiconductor devices-cooling module so that higher cooling performance is realized. However, the structure disclosed in Japanese Utility Model Examined Publication No. 3-7960 has not disclosed an overall refrigerant circulation system. Further, no consideration has been taken in this Publication about the hydrodynamic stability of the cooling system.

Japanese Patent Application Laid-Open (Unexamined Publication) No. 4-113660 has disclosed an improved structure of semiconductor devices-cooling module having partition walls 7A between adjacent ones of a plurality of semiconductor devices on a substrate.

SUMMARY OF THE INVENTION

The present invention is directed to overcome the foregoing problems at least partly and therefore it is an object of the present invention to provide an apparatus for cooling semiconductor devices and a semiconductor apparatus having the apparatus for cooling semiconductor devices which is capable of, at least partially, overcoming the foregoing problems and in which a refrigerant flow can be stabilized, and accordingly, the refrigerant flow can be stably circulated so that cooling of semiconductor devices can be stably performed.

Another object of the present invention is to provide an apparatus for cooling semiconductor devices and a semiconductor apparatus having the same that has a structure in which operation or work for maintaining its semiconductor devices-cooling module or the semiconductor devices thereof can be performed easily and which is able to eliminate a fear of mixing of contamination substances into the refrigerant during the maintenance work.

Another object of the present invention is to provide a computer comprising the apparatus for cooling semiconductor devices that has a cooling structure which exhibits good cooling performance and which can be maintained easily.

Another object of the present invention is to provide a method of manufacturing the apparatus for cooling semiconductor devices that has a cooling structure which exhibits good cooling performance and which can be maintained easily and a method of maintaining the apparatus for cooling semiconductor devices.

Another object of the present invention is to provide an apparatus for cooling semiconductor devices having a safety device which is operated in emergency, for example, when the pump is stopped.

At least a part of the foregoing objects can be achieved by an apparatus for cooling semiconductor devices comprising: a semiconductor devices cooling module for cooling semiconductor devices, including a container having an inlet port for a refrigerant and an outlet port for the refrigerant and a board on which at least one semiconductor device is so mounted in the container as to be dipped in the refrigerant flowing from the inlet port to the outlet port in the container as to be cooled by the flow of the refrigerant; a refrigerant cooling device adapted to receive via an outlet pipe the refrigerant discharged from the outlet port of the module so as to cool the refrigerant; a refrigerant circulation pump for receiving, via a suction pipe, the refrigerant cooled by the refrigerant cooling device and for sending the refrigerant to the module via an inlet pipe; and refrigerant-flow stabilizing means for stabilizing a refrigerant circulation flow discharged from the refrigerant circulation pump to be returned to the refrigerant circulation pump via the module and the refrigerant cooling device.

Since the apparatus for cooling semiconductor devices according to the present invention has the refrigerant-flow stabilizing means, the refrigerant flow can be stabilized and, accordingly, the refrigerant flow can be circulated stably so that semiconductor devices in the module can be cooled stably.

According to a preferred embodiment of the present invention, the refrigerant-flow stabilizing means comprises a module outlet-side pump, disposed at an intermediate position of the outlet pipe, for sucking the refrigerant from the outlet port of the module and for discharging the refrigerant toward the refrigerant cooling device. Since the pressure of the gas-liquid two-phase refrigerant flow, which has cooled the semiconductor device due to heat transfer by means of the forced convection and boiling of the refrigerant in the module and a portion of which has been gasified (boiled), is pressure-raised by the module outlet-side pump at the outlet pipe followed by discharge, an effect of mixing of the two-phase flow can be enhanced. As a result of the enhancement of mixing, the two-phase flow is made to be a bubble flow, resulting in a stable flow. Therefore, a fear of propagation of the pressure change from the outlet pipe system to the module can be reduced. Hence, a saturation temperature of the refrigerant within the module can be maintained at a constant level and, accordingly, the performance of cooling the semiconductor device in the module can be stabilized.

The module outlet-side pump should be of a type capable of sending a gas-liquid two-phase flow. However, it is preferable that the pump is a suction-type pump such as a jet pump. The "suction-type pump" is meant a pump of a type having no mechanically movable portion in a region thereof through which the gas-liquid two-phase flow passes. Therefore, for example, drive fluid of a jet pump may be flown by any means.

An apparatus for cooling semiconductor devices according a preferred embodiment of the present invention further comprises a branched pipe branched at an intermediate position of the inlet pipe connecting the refrigerant circulation pump and the module, and having a downstream portion connected to the jet pump so as to make a bypass flow passing therethrough to be a drive flow for the jet pump, and valve mechanisms provided at the inlet pipe and the branched pipe in a downstream of a branched point of the branched pipe, for controlling the pressures of the refrigerant to be supplied respectively to the module and the jet pump.

In an apparatus for cooling semiconductor devices according to a preferred embodiment of the present invention, the module the module outlet-side pump and the refrigerant cooling device are disposed in the vertical direction in this sequential order when viewed from the lowest position.

An apparatus for cooling semiconductor devices according to a preferred embodiment of the present invention further comprises a heat generating member having a lower heat generation density than that of the module between the jet pump and the inlet pipe, wherein a refrigerant fluid passage passing through the heat generating member that generates heat at the low heat generation density to the jet pump is provided such that a part of the refrigerant having been cooled by the refrigerant cooling device is caused to cool a heat generating member that generate heat at a low density and then serve as drive fluid for the jet-stream pump.

An apparatus for cooling semiconductor devices according to a preferred embodiment of the present invention has an arrangement that one of the refrigerant cooling device and the module has a pressure-change absorbing mechanism for suppressing pressure change in the outlet pipe, the pressure-change absorbing mechanism being allowed to be connected to a portion adjacent to a refrigerant-return header of the module.

An apparatus for cooling semiconductor devices according to a preferred embodiment of the present invention has an arrangement that the refrigerant-flow stabilizing means is said outlet pipe so disposed that its upstream portion is not lower than its downstream portion so as to make the refrigerant flow to be at least one of horizontal flow and upflow from the refrigerant outlet port of the module to the refrigerant inflow port of the refrigerant cooling device. In this case, the outlet pipe system is so constituted that the refrigerant flow is composed of horizontal flow and upflow or only upflows. That is, the arrangement so made that downflow portion is absent gradually raises vapor bubbles toward downstream due to the difference in the specific gravity between vapor bubbles and refrigerant fluid. Therefore, clogging of the outlet pipe occurring due to vapor bubbles and unstable pulsation due to growth of vapor bubbles can be suppressed. Therefore, the two-phase flow in the outlet pipe can be stabilized and, accordingly, stable cooling performance can be obtained.

An apparatus for cooling semiconductors according to a preferred embodiment of the present invention has an arrangement that the refrigerant-flow stabilizing means comprises a resistance element which increases a hydraulic pressure loss of the inlet pipe. In this case, the resistance element restricts change in the flow rate liable to take place due to pressure change peculiar to the two-phase flow present in the downstream portion of the module, that is, in the outlet pipe so that stable cooling performance can be obtained.

An apparatus for cooling semiconductor devices according to a preferred embodiment of the present invention has an arrangement that the refrigerant-flow stabilizing means comprises a bypass pipe having one end branched from the inlet pipe, the bypass pipe having a downstream portion connected to the outlet pipe.

In this case, the bypass pipe enables vapor bubbles generated in the module and cold refrigerant before being introduced into the module to be mixed in the outlet pipe. Therefore, vapor bubbles can be condensed, the quantity of vapor bubbles in the refrigerant circulation system can be reduced and the hydrodynamic stability of the refrigerant circulation system can be improved. As a result, stable cooling performance can be obtained.

An apparatus for cooling semiconductor devices according to a preferred embodiment of the present invention has an arrangement that the refrigerant-flow stabilizing means comprises a flow-rate control valve disposed at the inlet port of the module to control a flow rate of the refrigerant to be introduced into the module, a sensor for detecting a quantity of boiled bubbles of the refrigerant passing through the outlet port of the module, and control means for controlling a degree of opening of the flow-rate control valve in accordance with the quantity of boiled bubbles detected by the sensor.

In this case, control of the degree of opening of the flow-rate control valve enables the refrigerant to be flown at a desired flow rate for allowing vapor bubbles required for boiling heat transfer to be generated and for enabling the to suppress overgrowth of vapor bubbles in the module and the outlet pipe. Therefore, the quantity of vapor bubbles in the refrigerant circulation system is controlled so that the hydrodynamic stability of the refrigerant circulation system is improved. As a result, stable cooling performance can be obtained.

At least a part of the objects of the present invention can be achieved by an apparatus for cooling semiconductor devices comprising at least one semiconductor devices cooling module for cooling semiconductor devices, the module including a container having an inlet port for the refrigerant and an outlet port for the refrigerant, a board on which a plurality of semiconductor devices are so mounted in the container as to be dipped in the refrigerant flowing from the inlet port to the outlet port in the container and to be cooled by the flow of the refrigerant, the board constituting a part of a wall of the container, and a cooling system for cooling the module, wherein the cooling system has a pump for sending the refrigerant, a refrigerant cooling device for cooling the refrigerant, and a system of pipes for connecting the pump, the module and the refrigerant cooling device to circulate the refrigerant from a discharge port of the pump to the inlet port of the module, from the outlet port of the module to an inflow port for the refrigerant of the refrigerant cooling device, and from an outflow port for the refrigerant of the refrigerant cooling device to the pump, and the inflow port of the refrigerant cooling device is disposed at a level higher than the outlet port of the module.

An apparatus for cooling semiconductor devices according to a preferred embodiment of the present invention has an arrangement that the outlet port of the module is opened at the highest position of the module.

An apparatus for cooling semiconductor devices according to a preferred embodiment of the present invention has an arrangement that the module has the inlet port at a lower portion thereof and the outlet port at an upper portion thereof higher than the lower portion, and the module and the refrigerant cooling device are so disposed at relative positions as to make a refrigerant flow in an outlet pipe connecting the outlet of the module and the inflow port of the refrigerant cooling device to be composed of at least one of horizontal flow and upflow.

An apparatus for cooling semiconductor devices according to a preferred embodiment of the present invention has an arrangement that the pump is disposed at a level lower than the refrigerant cooling device.

An apparatus for cooling semiconductor devices according to a preferred embodiment of the present invention further comprises, at the inlet port of the module a flow resistance element for increasing a hydraulic pressure loss of the refrigerant to be supplied from the pump.

An apparatus for cooling semiconductor devices according to a preferred embodiment of the present invention further comprises a volume-variable container, an inside of which is communicated with a refrigerant passage within the refrigerant cooling device, at a downstream of the module in terms of the refrigerant circulation system, for example, at a top of the refrigerant cooling device. In this case, the container, for example, a bellows container, which is disposed at the downstream of the modules and the volume of which can be varied by the internal pressure, absorbs the pressure change of the outlet pipe system. Therefore, the saturation temperature of the refrigerant within the module can be maintained at a constant level and, accordingly, stable cooling performance can be obtained.

An apparatus for cooling semiconductor devices according to a preferred embodiment of the present invention has an arrangement that the module has a supply member for leading the refrigerant to a plurality of the semiconductor devices, a refrigerant supply header for distributing, to the refrigerant supply member, the refrigerant introduced through the inlet port of the container of the module into the container, a refrigerant discharge passage formed by the refrigerant supply member and partition members for surrounding the plurality of the semiconductor devices, and a refrigerant return header for collecting the refrigerant discharged from the refrigerant discharge passage to send the refrigerant to the outlet port. In this case, the partition members surrounding the semiconductor devices mounted in the module enhances turbulence of the refrigerant flow in the module and causes cold refrigerant fluid to be supplied to the surfaces of the heat-generating semiconductor devices. Therefore, boiling and cooling are enhanced so that the cooling efficiency is raised. Since mixing takes place between the surrounding cold refrigerant fluid (in an undercooled state) and vapor bubbles generated due to boiling of the refrigerant fluid on the surfaces of the heat-generating semiconductor devices, condensation of vapor bubbles is enhanced. As a result, the quantity of vapor bubbles in the foregoing unit or apparatus can be reduced and, accordingly, the hydrodynamic stability of the refrigerant circulation system can be improved. Since the partition members in the module prevent mixture of circulation flow of the refrigerant around one semiconductor device with those around the other semiconductor devices adjacent thereto, uniform cooling performance can be obtained.

An apparatus for cooling semiconductor devices according to a preferred embodiment of the present invention further comprises a bypass pipe branched from a pipe of the pipe system arranged between the discharge port of the pump and an inlet port of the module, the bypass pipe having a downstream portion connected to a pipe of the pipe system arranged between the outlet port of the module and the inflow port of the refrigerant cooling device.

An apparatus for cooling semiconductor devices according to a preferred embodiment of the present invention has an arrangement that a pipe of the pipe system arranged between the outlet port of the module and the inflow port of the refrigerant cooling device is provided with cooling means for exchanging heat to and form the refrigerant in the pipe via the pipe to cool the refrigerant.

An apparatus for cooling semiconductor devices according to a preferred embodiment of the present invention further comprises a valve for controlling a flow rate of the refrigerant at the inlet port of the module, and a sensor for detecting a quantity of boiled bubbles of the refrigerant at the outlet port of the module, and control means for controlling a degree of opening of the flow-rate control valve in response to an output signal from the sensor.

An other part of the foregoing objects of the present invention can be achieved by an apparatus for cooling semiconductors according to a preferred embodiment of the present invention further comprising a check valve at an intermediate position of an inlet pipe of the pipe system connecting a discharge port of the pump and the inlet port of the module, a bypass passage pipe having one end branched from the inlet pipe at a position downstream of the check valve and upstream of the inlet port of the module and connected, at another end thereof, to a pipe of the pipe system connecting the outlet port of the module and the inflow port of the refrigerant cooling device, and a valve and refrigerant accommodating container at an intermediate position of the bypass passage pipe, the valve being adapted to be opened when the pump is stopped, and the refrigerant accommodating container being adapted to supply the refrigerant to the module when the valve is opened.

In this case, cold refrigerant in the refrigerant container is introduced into the module upon emergency, for example, upon stop of the pump. As a result, cooling can be effected for a short time so that spare time can be given to, for example, transfer data having been stored in the semiconductor devices of the module. As a result, safety in case of emergency can be secured. Further, flowing-out of the refrigerant can be prevented even in case of emergency and, accordingly, a fear that the environment of the computer room or the like is contaminated can be avoided.

At least a part of an other part of the foregoing objects can be achieved by an apparatus for cooling semiconductor devices comprising at least one semiconductor devices cooling module for cooling semiconductor devices, each module including a container having an inlet port for the refrigerant and an outlet port, a board on which a plurality of semiconductor devices are so mounted in the container as to be dipped in the refrigerant flowing from the inlet port to the outlet port in the container and to be cooled by the flow of the refrigerant, the board constituting a part of a wall of the container, and a cooling system for cooling the module, wherein the cooling system for cooling the module, wherein the cooling system has a pump for sending the refrigerant, and a pipe system for forming a closed refrigerant passage including the pump and the container by connecting a refrigerant-discharge port and a refrigerant-suction port of the pump to the inlet port and the outlet port of the container of the module, respectively, and wherein a refrigerant cooling device for cooling the refrigerant by heat transfer thereof with cooling fluid or air etc. is disposed at an intermediate position of a pipe of the pipe system arranged between the outlet port of the module and the suction port of the pump.

The semiconductor devices cooling module(s) mounted on, for example, an IP board, a pipe system connected to the module(s), the refrigerant cooling device and pump connected in series via the pipe system form a refrigerant circulation system for cooling semiconductor devices incorporated in the module(s) by heat transfer due to forced convection and boiling of refrigerant fluid. Since the foregoing components form the closed loop, the refrigerant which is forcibly circulated does not flow out of the system.

According to a preferred embodiment of the present invention, the module is mounted on a mother board, and the mother board has a connector, at an edge portion thereof, for supplying electric energy to the mother board and to for input/output of an electric signal from a main body of a computer apparatus to the mother board.

In this case, the mother board, such as an IP board, and the module mounted on the IP board can provide an integral arithmetic control unit which can be connected through the connector at the edge portion of the IP board with an apparatus main body such as a computer main body. Since the semiconductor apparatus or the computer having the semiconductor apparatus has the arrangement that the cooling system and the electric signal control portion are integrated, the IP board and the cooling system can be simultaneously changed if a part of the electric signal control portion or the cooling system develops a failure. Therefore, the exchange can be performed easily.

According to a preferred embodiment of the present invention, the refrigerant cooling device includes therein a cooling-fluid passage through which cooling fluid flows for exchanging heat with the refrigerant in a non-contact manner, and a coupler, to which an external pipe for introducing/discharging the cooling fluid to/from the cooling-fluid passage of the refrigerant cooling device is detachably connected, is attached to the refrigerant cooling device, whereby the mother board can be separated from the main body of the computer apparatus by detaching the external pipe from the coupler and by disconnecting the connector. In this case, the external pipe can be attached/detached to/from the coupler, the mother board such as the foregoing IP board can be exchanged further easily. Heat generated in the module is subjected to be transferred to cooling water introduced from the external pipe connected by the coupler within the refrigerant cooling device so that heat can be removed outwardly. As a result, cooling efficiency can be improved. Further, a semiconductor unit can be exchanged by each mother board at the user's site at the time of maintenance and, accordingly, the installation environment of the semiconductor apparatus is not contaminated. In addition, mixing or incorporation of impurities or contamination substances into the refrigerant pipe can be prevented.

The foregoing and other objects, features as well as advantages of the invention will be made clearer hereafter from detailed description of preferred embodiments of the invention referring to attached drawings.

DETAILED DESCRIPTION OF PREFERRED EMBODIMENTS

Figure 1:
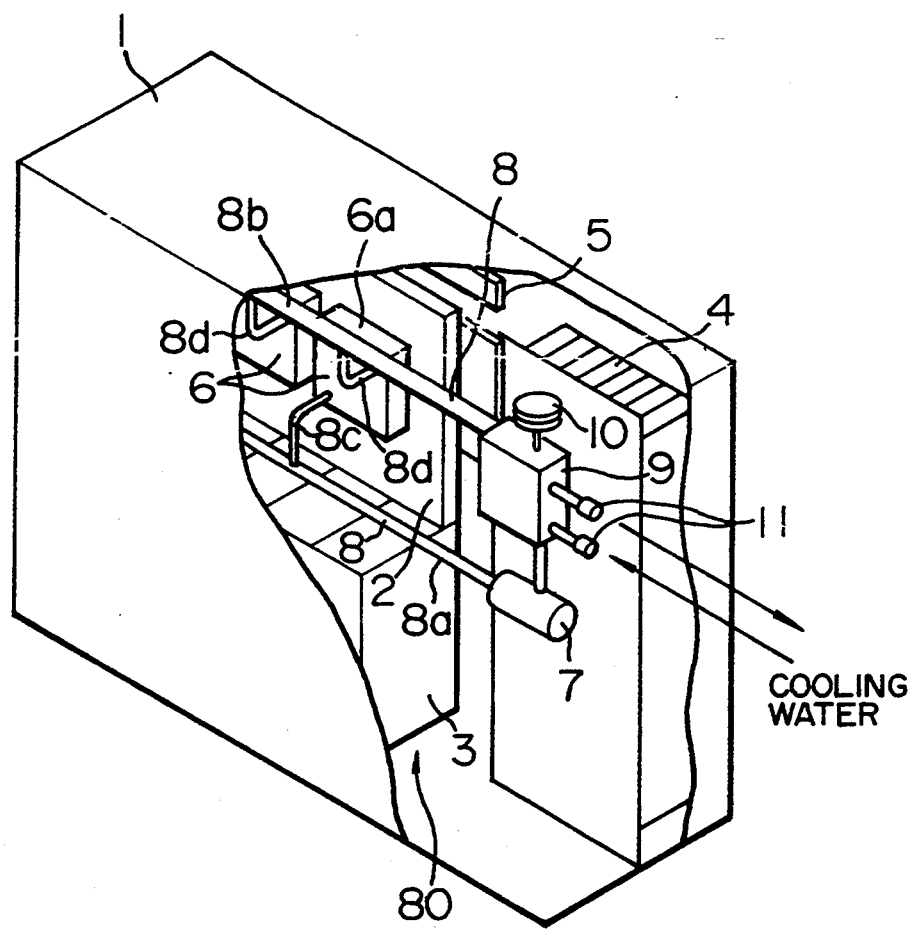
FIG. 1 is a partially broken perspective view which illustrates an example of an electronic computer having an apparatus for cooling semiconductor devices, formed into a unit including a refrigerant circulation system, according to an embodiment of the present invention.

An apparatus 80 for cooling semiconductor devices and a computer 90, which comprises the apparatus 80, according to an embodiment of the present invention will now be described with reference to FIGS. 1 and 2. The computer 90 accommodates, in a frame 1 thereof, an instruction processor (IP) constituted by a wiring board 2 and several semiconductor devices-cooling modules mounted on the board, a power supply module 3, memory modules 4 and power-supply bars 5. Modules 6 for cooling semiconductor devices, i.e. semiconductor devices cooling modules 6, are mounted on the IP board 2. Each of the semiconductor devices cooling modules 6 has plural semiconductor devices, to be described later with reference to FIGS. 13 and 14, mounted thereon. The modules 6, a refrigerant-circulating pump 7 for circulating refrigerant or cooling medium and a refrigerant cooling device 9 are integrated or formed into a unit by a system of pipes 8 so that one apparatus 80 for cooling semiconductor devices is formed. The refrigerant cooling device 9 has a bellow-shape volume-variable container 10 connected thereto. Further, the refrigerant cooling device 9 is supplied with cooling water from outside via a coupler 11 to which an external system of pipes (omitted from illustration) can be attached/detached. The refrigerant is a fluorocarbon type refrigerant.

Figure 13:
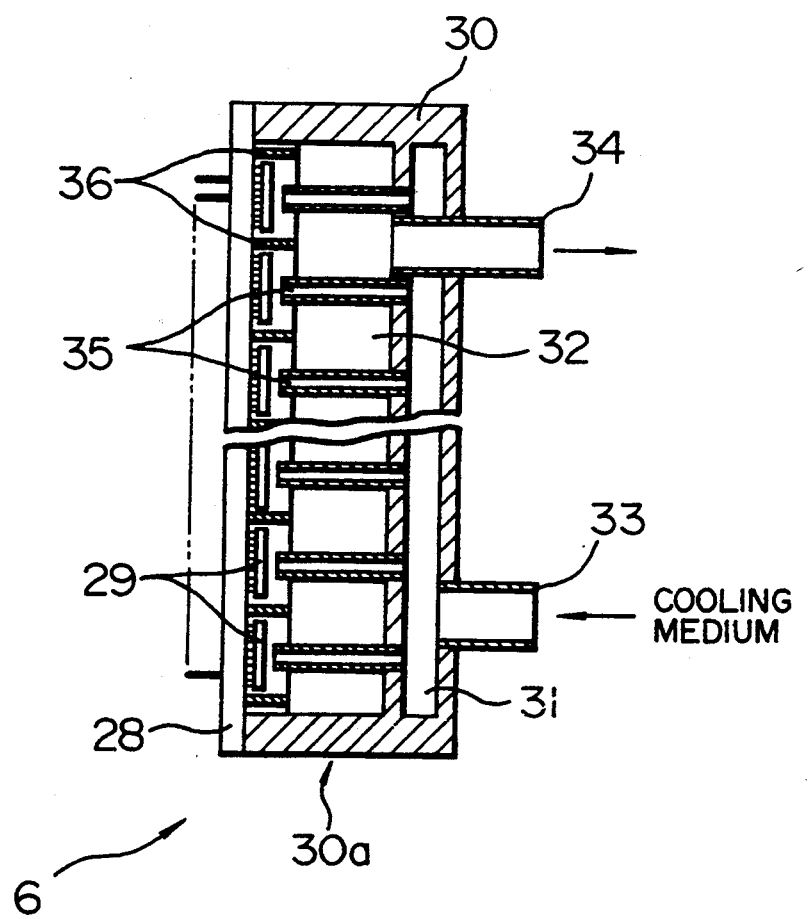
FIG. 13 is a sectional view which illustrates an example of a semiconductor devices-cooling module.
Figure 14:
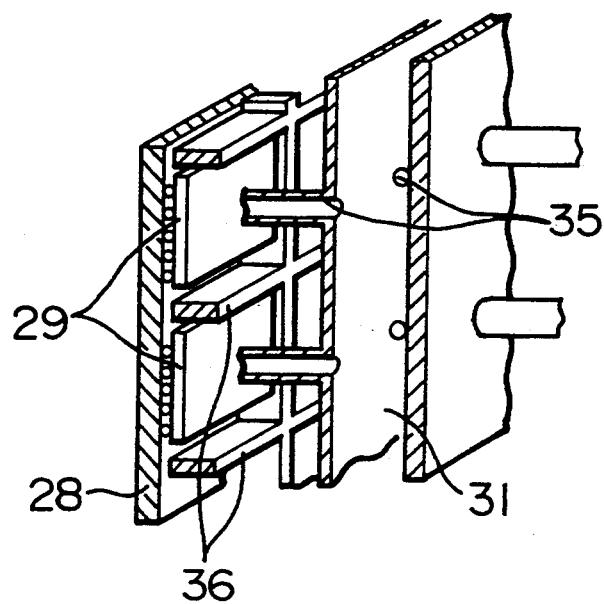
FIG. 14 is a perspective view which illustrates an example of partition members surrounding semiconductor chips in the module shown in FIG. 13.

Prior to describing a cooling operation of the semiconductor devices cooling apparatus 80, a preferred example of the semiconductor devices cooling module 6 will now be described with reference to FIGS. 13 and 14. Referring to FIGS. 13 and 14, a multiplicity of integrated circuit chips 29 as the semiconductor devices are mounted on a circuit board 28. A surface of the circuit board 28, on which the chips 29 are mounted, is sealed up by a casing 30 which forms a container 30a in association with the board 28. That is, this example has an arrangement that the board 28 forms a part of the sealing container 30a as well as serving as the board on which the IC chips 29 are mounted. The casing 30 is formed into a double structure composed of an inlet space portion or inlet header portion 31 serving as a distributor and an outlet space portion or outlet header portion 32 serving as a collector. A pipe 33 for introducing the refrigerant into the container 30a and a pipe 34 for allowing the refrigerant to flow out from the container 30a are connected to the inlet and outlet header portions 31 and 32, respectively. The inlet header portion 31 has nozzles 35 extending, through the outlet header portion 32, to positions at which the nozzles 35 face to the respective integrated circuit chips 29 mounted on the board 28. Further, partition members 36 are disposed around each of the integrated circuit chips 29 mounted on the board 28.

FIG. 14 illustrates a state where the partition members 36 are attached around the chips 29. The partition member 36 is disposed to form a lattice that surrounds each chip 29.

The operation of cooling the chips 9 to be performed in the module 6 will now be described. The refrigerant introduced into the inlet header portion 31 through the inlet pipe 33 is distributed to each nozzle 35. The refrigerant distributed to each nozzle 35 is formed into a jet that impinges against a surface of the heat-generating chip 29. As a result, the refrigerant removes heat from the chips 29 while boiling on the surface of the chip 29, and then it passes through the outlet header portion 32 to be discharged to an outside portion of the semiconductor devices cooling module 6 through the outlet pipe 34. The partition members 36 disposed around the chips 29 serve to prevent interference of flows between the adjacent chips 29 and 29. Even if the modules 6 are mounted vertically as shown in FIGS. 1, 13 and 14, the partition members 36 prevent an upper chip 29 from being covered with vapor bubbles of the refrigerant generated at a lower chip 29. Further, the partition members 36 enhance turbulence of the refrigerant flow to improve the cooling efficiency. In addition, they enhance the condensation of the vapor bubbles generated due to boiling of the refrigerant liquid on the surfaces of the devices 29 so that a quantity of the vapor bubbles is reduced and, accordingly, hydrodynamic stability of the refrigerant circulation system is improved. As a result, the chips 29 which generate heat at a high heat generation density of several 10 W/cm$^2$ can stably be cooled.

In the semiconductor devices cooling module 6, the board 28 may be disposed in a direction to extend horizontally. Further, an internal structure of each of the modules 6 is not limited to the structure shown in FIGS. 13 and 14 if the semiconductor devices 29 can be sufficiently cooled by the heat transfer due to the forced convection and boiling of the refrigerant.

Referring back to FIG. 1, the operation of the semiconductor devices cooling apparatus 80 will now be described. The refrigerant to be circulated in the apparatus 80 by the refrigerant pump 7 is sent to the semiconductor devices cooling module 6 via a main inlet pipe 8a and a branched inlet pipes 8c, and then the refrigerant is brought into direct contact with the surfaces of the multiplicity of the semiconductor devices 29 of a high heat generation density which are mounted in the module 6. The refrigerant cools the heat-generating devices 29 by the heat transfer due to the forced convection of the refrigerant and the heat transfer due to boiling of the refrigerant. After the refrigerant has cooled the heat-generating devices 29, the refrigerant is sent from the outlet pipe 34 of the module 6 to a refrigerant cooling device 9 via branched outlet pipes 8d and a main outlet pipe 8b. The refrigerant is cooled by the refrigerant cooling device 9, and then it is returned to the pump 7. The refrigerant cooling device 9 is supplied with cooling water via the couplers 11 to which the external pipes for cooling water (omitted from illustration) can be attached/detached. The refrigerant cooling device 9 is a kind of a heat exchanger so that heat generated by the heat-generating devices 29 and transferred to the refrigerant is transferred to the cooling water due to heat exchange taken place between the refrigerant and cooling water in the refrigerant cooling device 9. As a result, heat is, by the cooling water, removed to the outside. The volume-variable container 10 connected to the refrigerant cooling device 9 maintains the pressure of the refrigerant in the refrigerant cooling device 9 at substantially an atmospheric pressure to be a standard of the pressure in the refrigerant circulation system.

That is, the pressure applied to the semiconductor devices 29 is a sum of the standard pressure and an additional pressure raised by the pump 7. In order to minimize the pressure acting on the semiconductor devices 29, it is preferable that the standard is set to a low level. Accordingly, the standard is set to the atmospheric pressure. However, if the standard is set to a level lower than the atmospheric pressure, a difference from the atmospheric pressure is undesirably applied to the IC chip 29 when the pump 7 is not operated. Therefore, it is preferred that the standard pressure is set to a level as low as the atmospheric pressure. By making the standard pressure to be a constant level, the pressure at the inlet port of the semiconductor devices cooling module 6 can be made constant. Therefore, the saturation temperature of the refrigerant in the module 6 can be made constant. As a result, the refrigerant can be used in its optimum temperature range to enhance cooling efficiency of the IC chips 29.

Since this embodiment has an arrangement that the circulation is forcibly made by the pump 7, the flow rate of the refrigerant (cooling medium) upon circulation thereof can easily be controlled and satisfactory cooling performance can be obtained so that the semiconductor device of very high heat generation density in the order of several 10 watts/cm$^2$ can be cooled satisfactorily.

Figure 2:
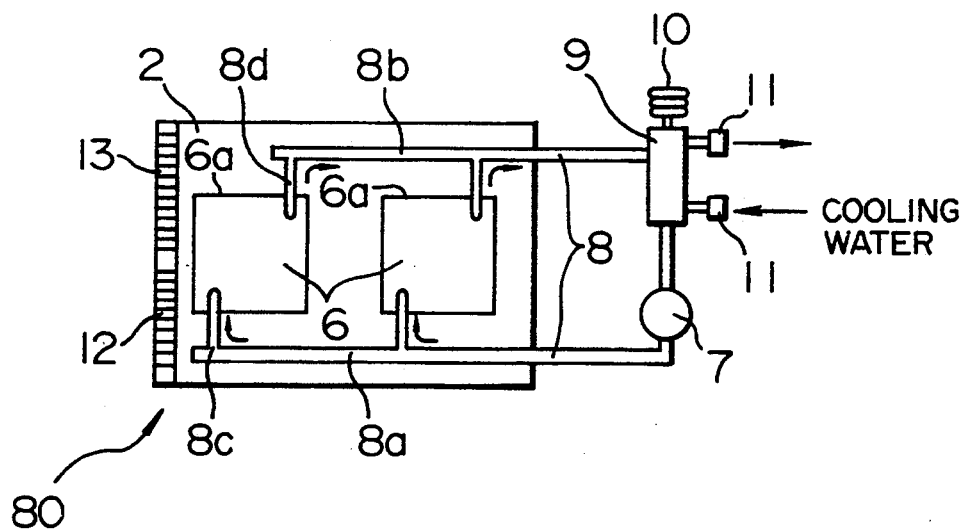
FIG. 2 is a front elevational view which illustrates the apparatus for cooling semiconductor devices formed into a unit according to the present invention shown in FIG. 1.

The semiconductor devices cooling apparatus 80 shown in FIG. 2 comprises the IP board 2 disposed vertically, the semiconductor devices cooling modules 6 mounted on the board 2 and having a multiplicity of the semiconductor devices 29 mounted therein and a cooling system for circulating the cooling medium to the modules 6, the cooling system including the pump 7, the pipe system 8 and the refrigerant cooling device 9.

By assembling the apparatus 80 into the unit and by filling and sealing the refrigerant in the cooling system beforehand in a supplier's factory, a necessity to perform decomposing and assembling operations at the user's site can be completely eliminated.

When it is required to change the module 6 at the user's site, the whole unit, that is, the whole apparatus 80 is completely exchanged for another apparatus 80. Since the changing operation is composed of separating the cooling-water couplers 11 and electrically and mechanically separating a power supply connector 12 and a signal connector 13 of the IP board 2 from associated connectors of a main body of the computer 90, the changing operation can significantly easily be completed. Since the operations such as decomposing and assembling the unit 80 are not made at the user's site, there is no possibility of introducing impurities such as contamination substances.

Although the embodiment shown in FIGS. 1 and 2 has an arrangement that one IP board 2 is composed of one circuit board, a conventional stacked boards or an arrangement, in which one IP board is composed of a plurality of boards, may be employed.

Figure 3:
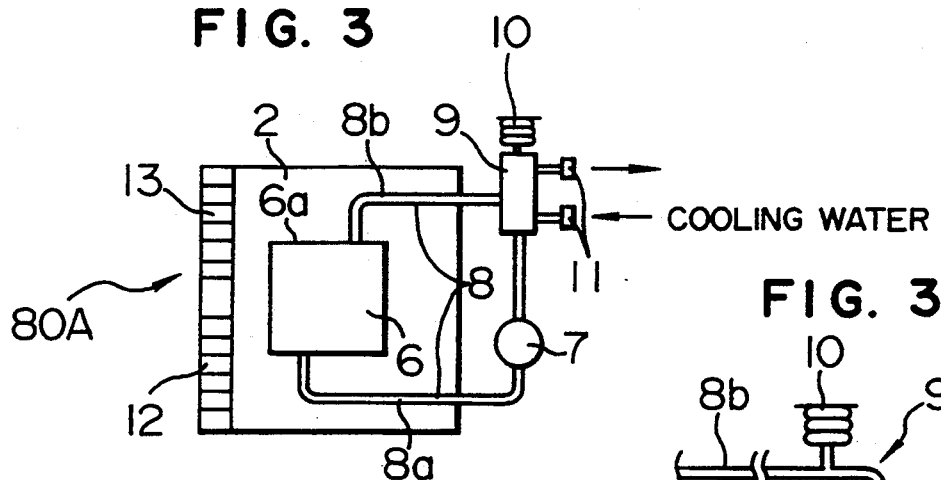
FIG. 3 is a front elevational view which illustrates an apparatus for cooling semiconductor devices, formed into a unit, according to another embodiment of the present invention.

Although the embodiment shown in FIGS. 1 and 2 has an arrangement that two semiconductor devices cooling modules 6, 6 are mounted on one IP board 2, the present invention can similarly be adapted to an arrangement in which only one module 6 is mounted as exemplified by a semiconductor apparatus 80A according to an embodiment shown in FIG. 3. In this case, the branched pipes 8c and 8d on the inlet and outlet sides are omitted from the structure, but main pipes 8a and 8d on the inlet and outlet sides are respectively and directly connected to the inlet and outlet pipes 33 and 34 of the module 6.

The embodiments shown in FIGS. 1 to 3 comprise the components so disposed as to circulate the refrigerant from the pump 7 to the module(s) 6 followed by passing the refrigerant through the refrigerant cooling device 9 to return it to the pump 7. Further, the outlet pipe system of pipes 8b, 8d establishing the connections between the modules 6 and the refrigerant cooling device 9 are so arranged as to make the refrigerant flow to be only horizontal and/or upward flow(s). As shown in FIG. 2, the flow from the pump 7 passes through the main inlet pipe 8a disposed substantially horizontally, and then the flow is introduced into the modules 6 through the branched inlet pipes 8c branched substantially vertically from the main pipe 8a. After the flow has passed through the modules 6, the flow passes through the branched outlet pipes 8d disposed substantially vertically, followed by introduction into the main outlet pipe 8b disposed substantially horizontally. Then, the flow is introduced from the main outlet pipe 8b into the refrigerant cooling device 9, followed by returning to the pump 7. The junction between the refrigerant cooling device 9 and the main outlet pipe 8b is disposed above the outlet pipes 34 of the semiconductor devices cooling modules 6, preferably above the uppermost surfaces 6a of the modules 6 as illustrated. By constituting the structure as described above, unstable flows liable to be generated in the downflow portion of the two-phase flow can be prevented. By eliminating downflow portions from the outlet pipe system 8c and 8d, of the refrigerant circulation system, in which the two-phase flow is generated, the hydrodynamic stability of the circulation system can be improved.

Figure 3A:
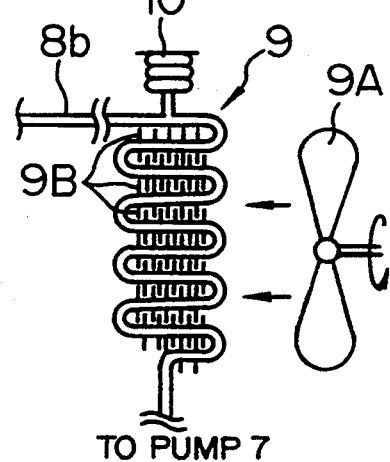
FIG. 3A is an explanatory view which illustrates another example of the refrigerant cooling device.

Although the foregoing embodiment comprises the refrigerant cooling device 9 using cooling water, the refrigerant, i.e. cooling medium, may be air-cooled by an air supply fan 9A in place of cooling water shown in FIG. 3A, reference symbol 9b denoting fins.

Figure 4:
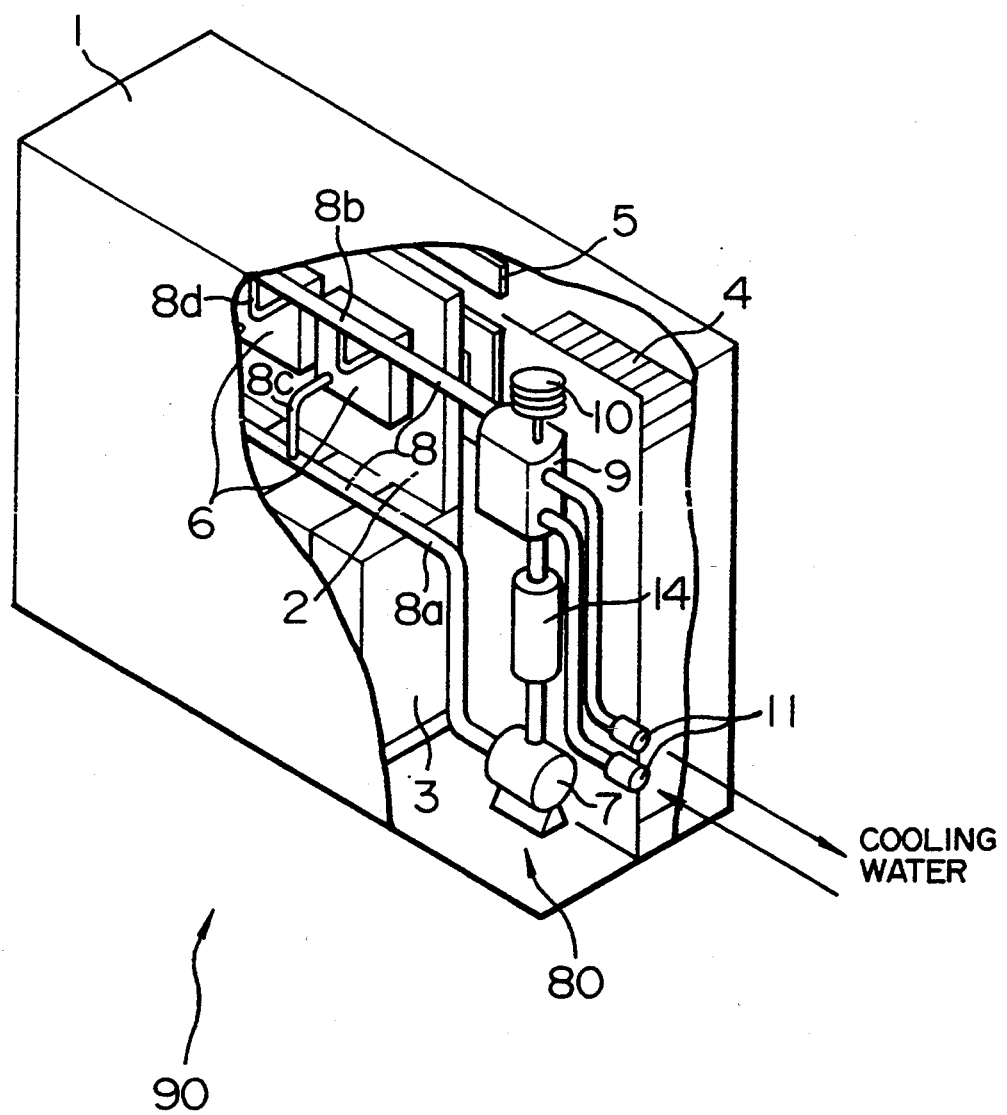
FIG. 4 is a partially broken perspective view which illustrates another example of the electronic computer having an apparatus for cooling semiconductor devices, including a refrigerant circulation system, according to still another embodiment of the present invention.
Figure 5:
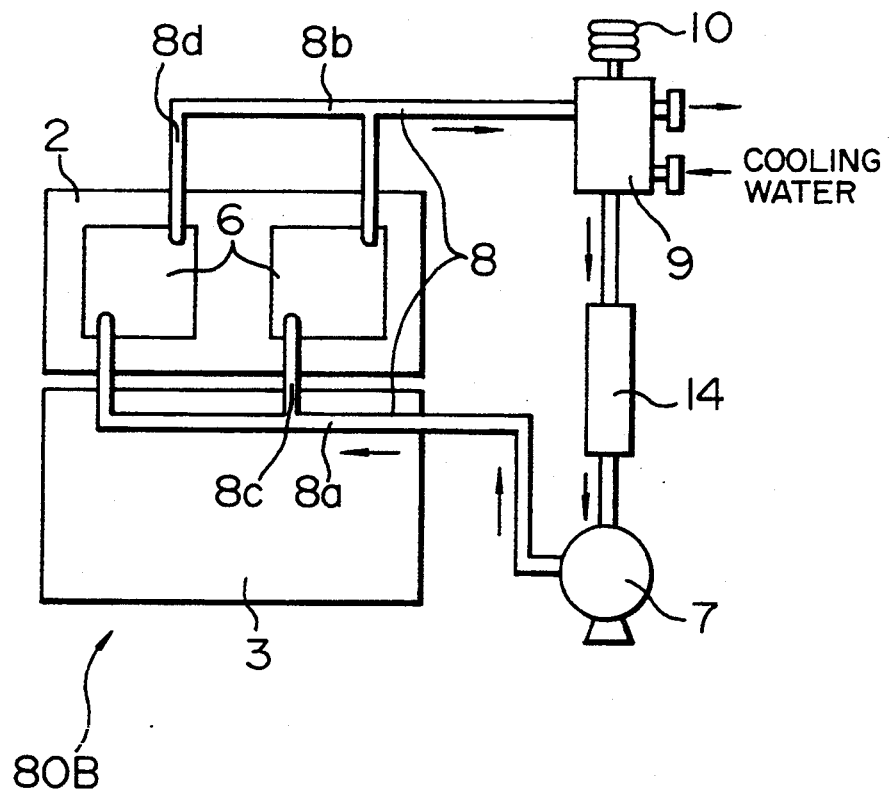
FIG. 5 is a front elevational view which illustrates an apparatus for cooling semiconductor devices according to still another embodiment of the present invention.

FIGS. 4 and 5 illustrate an apparatus 80B for cooling semiconductor devices and a computer 90A comprising the apparatus 80B according to another embodiment of the present invention. In this embodiment, semiconductor devices cooling module 6 is not made integral with or not formed into unit with the other parts of the refrigerant circulation system. That is, this embodiment has an arrangement that the pump 7 is of a type to be stationary positioned. This embodiment is enabled to improve the hydrodynamic stability by the components to circulate the refrigerant from the pump 7 to the modules 6 followed by flowing from the refrigerant cooling device 9 to the pump 7. The outlet pipe system 8d and 8b establishing the connections between the modules 6 and the refrigerant cooling device 9 are so constituted similarly to the foregoing embodiments that the flow of the refrigerant is composed of only horizontal flow and upflow. Since the refrigerant circulation system according to this embodiment is not formed into a unit, water contained in the refrigerant is removed by a refrigerant purifier 14 comprising an ion exchanger or a filter. However, the refrigerant circulation system may, of course, be formed into a unit.

Figure 6:
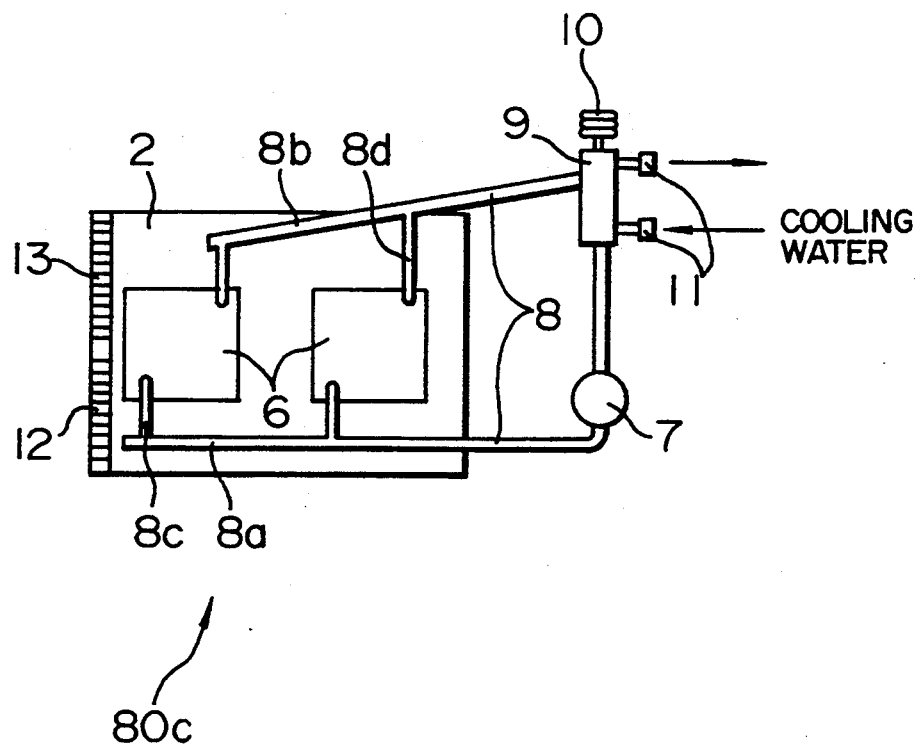
FIG. 6 is a front elevational view which illustrates an apparatus for cooling semiconductor devices, formed into a unit, according to still another embodiment of the present invention.

FIG. 6 illustrates an apparatus 80C for cooling semiconductor devices according to still another embodiment of the present invention. This embodiment has an arrangement that the modules 6 for cooling semiconductor devices and the other portions of the refrigerant cooling system are integrated or formed into a unit. Further, the outlet pipe system 8d and 8b establishing the connections between the modules 6 and the refrigerant cooling device 9 are so constituted that the flow of the refrigerant is composed Of only upflows. More specifically, the main outlet pipe 8b is obliquely disposed to be raised toward downstream. By omitting horizontal flow portions as well as omitting the downflow portions from the outlet pipe system 8d and 8b of the refrigerant circulation system, the hydrodynamic stability of the system can further be improved.

Figure 7:
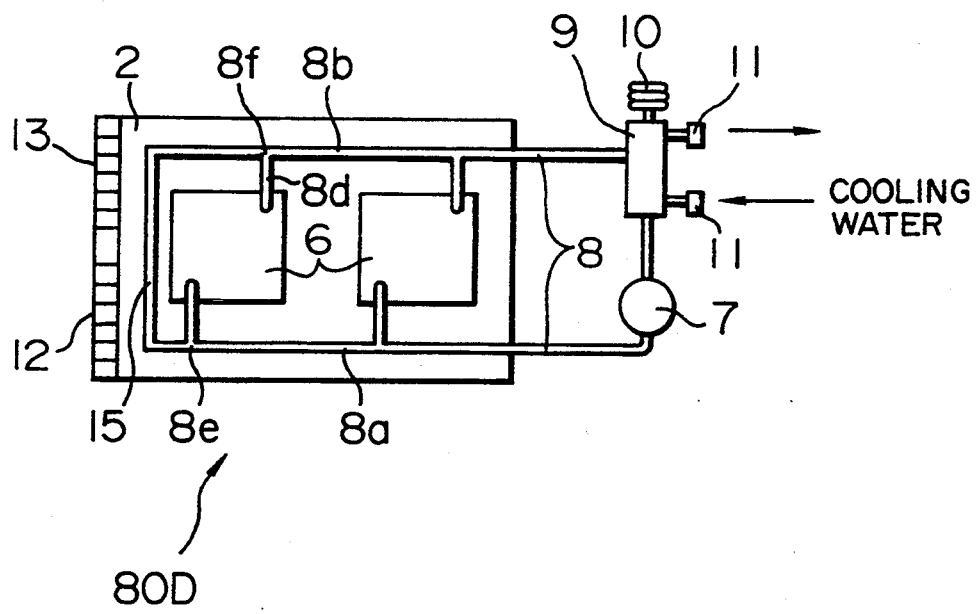
FIG. 7 is a front elevational view which illustrates an apparatus for cooling semiconductor devices, formed into a unit, according to still another embodiment of the present invention.

FIG. 7 illustrates an apparatus 80D for cooling semiconductor devices according to still another embodiment of the present invention. Also in this embodiment, the modules 6 for cooling semiconductor devices and the other portions of the refrigerant circulation system are integrated or formed into a unit. However, a bypass pipe 15 is disposed, from a branch portion 8e of the main inlet pipe 8a disposed between the refrigerant circulation pump 7 and the modules 6, that is, the bypass pipe 15 being arranged to be branched at a position more upstream than the inlet pipe 33 of the module 6, so as to return the refrigerant to the refrigerant cooling device 9 without passing through the modules 6. The bypass pipe 15 is joined to the main outlet pipe 8b at a position more downstream than the outlet pipe 34 of the modules 6 (at a downstream 8f of the branched outlet pipe 8d). As a result, vapor bubbles generated by the modules 6 and the cold refrigerant that has not been introduced into the modules 6 are joined together so that the vapor bubbles are condensed. Therefore, the quantity of vapor bubbles in the apparatus 80D can be reduced and the hydrodynamic stability of the refrigerant circulation system can be improved. Hence, stable cooling performance can be obtained.

Figure 8:
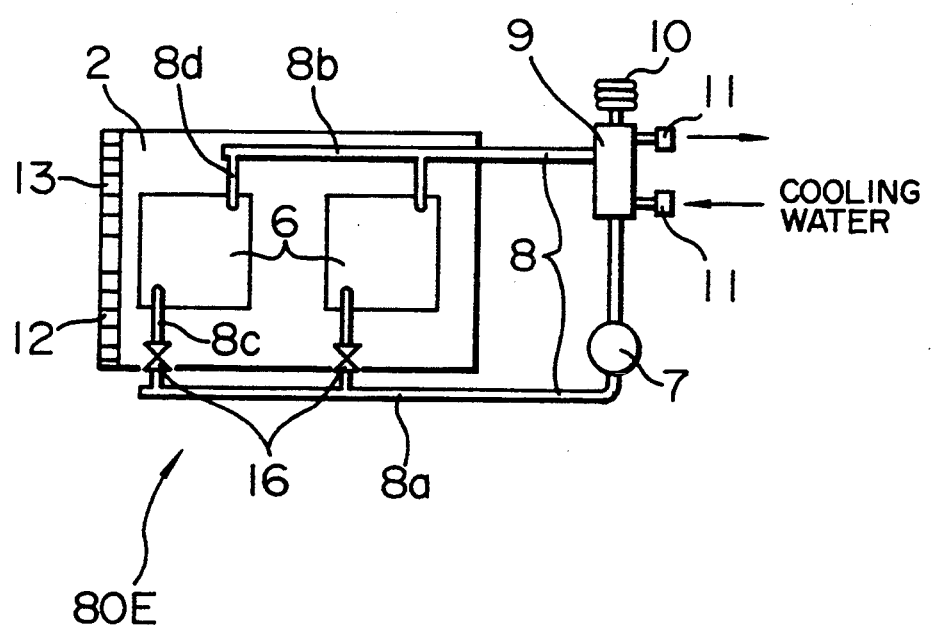
FIG. 8 is a front elevational view which illustrates an apparatus for cooling semiconductor devices, formed into a unit, according to still another embodiment of the present invention.

FIG. 8 illustrates an apparatus 80E for cooling semiconductor devices according to still another embodiment of the present invention. Also this embodiment has the arrangement that the semiconductor devices cooling modules 6 and the other portions of the refrigerant circulation system are integrated or formed into a unit. However, dislike the foregoing embodiments, valves 16 are disposed in the branched inlet pipes 8c to the modules 6, the valves 16 each having a flow resistance that is larger than a fluid pressure loss taken place in a portion from the outlets of the modules 6 to the pump 7. As a result, the change in the flow rate of the refrigerant is suppressed even when the changes in pressure proper to the two-phase flow present in the downstream portions from the modules 6, that is, in the outlet pipe system 8d and 8b occur. As a result, stable cooling performance can be obtained.

Figure 9:
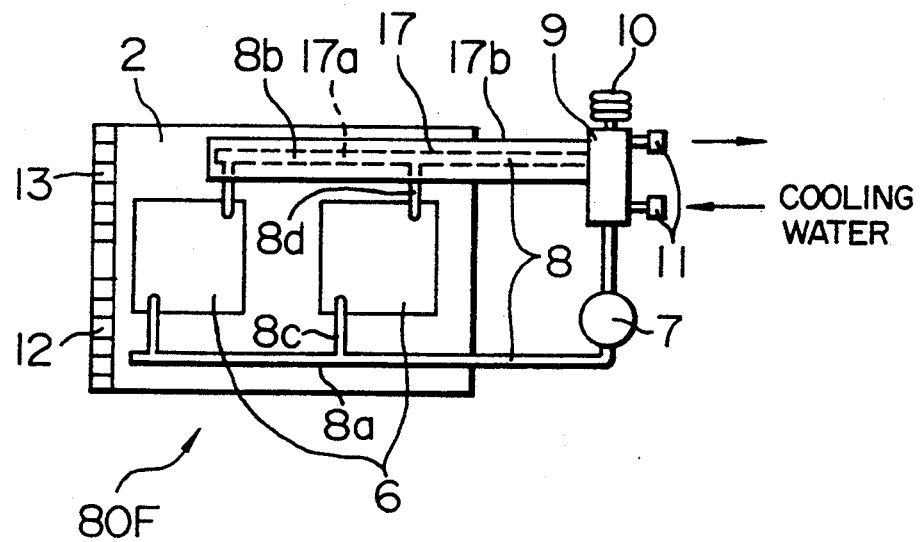
FIG. 9 is a front elevational view which illustrates an apparatus for cooling semiconductor devices, formed into a unit, according to still another embodiment of the present invention.

FIG. 9 illustrates an apparatus 80F for cooling semiconductor devices according to still another embodiment of the present invention. The embodiment has also an arrangement that the modules 6 for cooling semiconductor devices and the other portion of the refrigerant circulation system are integrated or formed into a unit. Further, the main outlet pipe 8b establishing the connection between the modules 6 and the refrigerant cooling device 9 is formed into a double pipe 17 that permits the refrigerant to flow through an inner pipe 17a and permits the cooling water to flow through an outer pipe 17b. As a result, the refrigerant in the pipe 8b, that is, pipe 17a is cooled. The branched outlet pipe 8d may, for course, be formed into a double pipe. By cooling the outlet pipe 8b which establishes the connection between the module 6 and the refrigerant cooling device 9, vapor bubbles generated by the module 6 can be condensed and, accordingly, the quantity of vapor bubbles in the semiconductor devices cooling apparatus 80F can be reduced. As a result, the hydrodynamic stability of the refrigerant circulation system can be improved and, accordingly, stable cooling performance can be obtained. If the main outlet pipe 8b can be cooled, fins or the like may be attached to the main outlet pipe 8b in place of having the pipe 8b in the form of double pipe.

Figure 10:
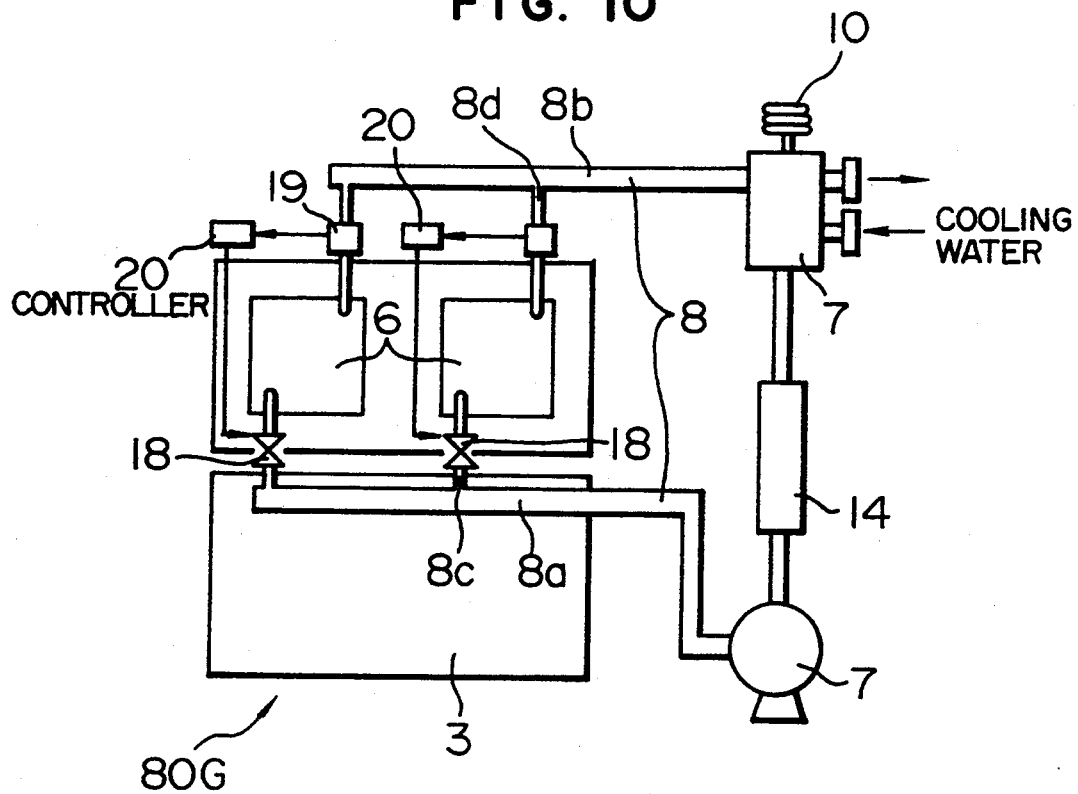
FIG. 10 is a front elevational view which illustrates an apparatus for cooling semiconductor devices, including a refrigerant circulation system, according to still another embodiment of the present invention.

FIG. 10 illustrates an apparatus 80G for cooling semiconductor devices according to still another embodiment of the present invention. The apparatus 80G comprises flow-control valves 18 disposed in the branched inlet pipes 8c of the semiconductor devices cooling module 6, and sensors 19 for detecting the flow rate of bubbles of the boiled refrigerant by means of, for example, change in the electrostatic capacity, the sensors 19 being disposed in the branched outlet pipes 8d. The sensors 19 transmit signals denoting the quantity of bubbles to controllers 20 to control the degrees of opening of the valves 18. Thus, the refrigerant can be allowed to flow through the modules 6 at an appropriate flow rate where bubbles are generated in the modules 6 due to boiling and cooling, while the bubbles do not grow in the pipes 8d and 8b. As a result, the hydrodynamic stability of the refrigerant circulation system can be improved and, accordingly, stable cooling performance can be obtained. Although this embodiment has the arrangement that the module 6 and the other portions of the refrigerant circulation system are not integral or formed into a unit, they may, of course, be formed into a unit. Further, the degree of opening of each valve 18 can be controlled in accordance with each of the heating values of the two semiconductor devices cooling modules 6. Therefore, the growth of vapor bubbles can be further finely suppressed.

Figure 11:
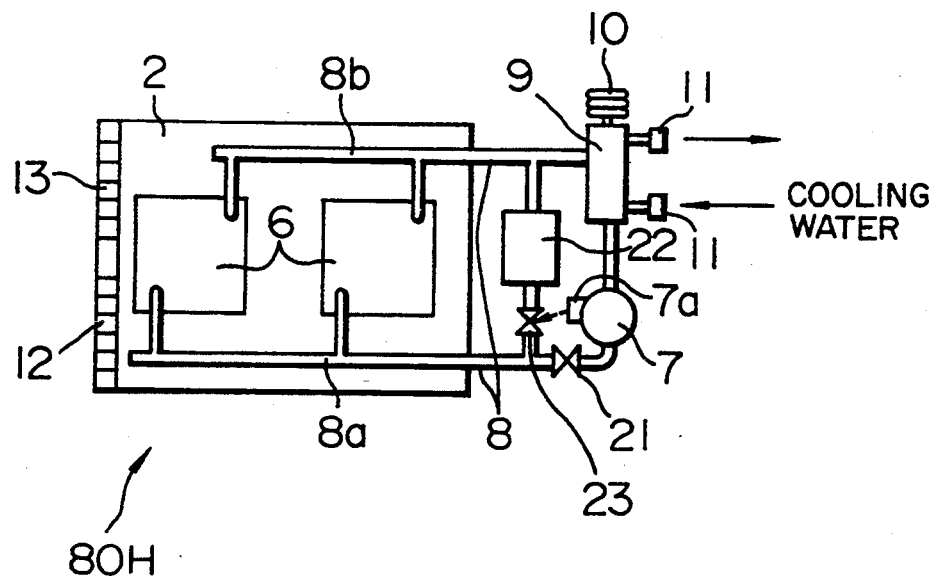
FIG. 11 is a front elevational view which illustrates an apparatus for cooling semiconductor devices, formed into a unit, according to still another embodiment of the present invention.

FIG. 11 illustrates an apparatus 80H for cooling semiconductor devices according to still another embodiment of the present invention. Also this embodiment has the arrangement that the semiconductor devices cooling modules 6 and the other portions of the refrigerant circulation system are formed into a unit. However, the differences from the foregoing embodiments lies in that a check valve 21 for preventing a back flow of the refrigerant is disposed at an intermediate position of the main inlet pipe 8a that establishes the connection between the refrigerant circulation pump 7 and the modules 6. Further, a pressure chamber size of a refrigerant container 22 including a volume-variable pressure chamber is connected, to a position downstream of the check valve 21 and as well as upstream of the modules 6, via a valve 23 that is opened in case of emergency such as stop of operation of the refrigerant circulation pump 7. The other side of the container 22 is connected to a position downstream of the modules 6 via the outlet pipe 8b. The stop or the like of the pump 7 is detected by a detector 7a to open the valve 23 in accordance with the result of the detection.

Figure 12:
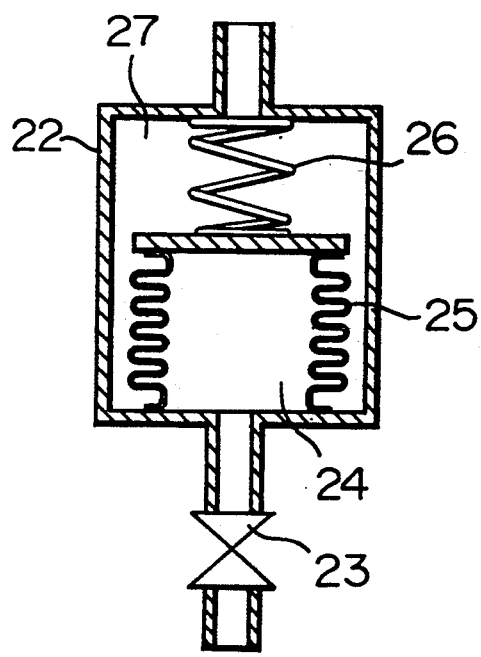
FIG. 12 is a vertical sectional view which illustrates an example of a refrigerant container including therein a pressurizing chamber.

FIG. 12 illustrates a detailed structure of an example of the refrigerant container 22. The refrigerant container 22 includes the volume-variable pressure chamber 24. The pressure chamber 24 is defined by a volume-variable container 25 in the form of a bellows, the volume-variable container 25 being pressurized by a spring 26. The pressure chamber 24 is hermetically closed by the valve 23 during a normal operation, while the pressure chamber 24 is communicated with the main inlet pipe 8a when the valve 23 is opened only in case of emergency.

The operation of this embodiment will not be described. If the refrigerant circulation pump 7 is stopped in emergency, the check valve 21 is closed and the valve 23 is simultaneously opened, causing the bellows container 25 to be compressed by the spring 26. As a result, the refrigerant is forcibly pushed out of the pressure chamber 24 so that the refrigerant is introduced into the semiconductor devices cooling modules 6. A part of the refrigerant in the main outlet pipe 6b of the modules 6 is sucked into a space 27 outside the pressure chamber 24 in the container 22. The mechanism constituted as described above enables the refrigerant to be supplied from the container 22 even if the pump 7 is stopped so that the IC chips 29 in the modules 6 are cooled for a short time. Therefore, overheating of the IC chip 29 can be prevented so that time to space for, transfer of data from the IC chips 29 or the like can be given. As a result, safety in case of emergency can be secured. Further, this embodiment prevents the refrigerant from flowing out of the system even in case of emergency and, accordingly, a fear that an environment such as a computer room is contaminated can be eliminate. If a part of the apparatus 80H for cooling semiconductor devices develops troubles, one whole apparatus 80H is exchanged for another apparatus 80H. Therefore, contamination of the environment can be prevented. Enclosing of the refrigerant into the volume-variable container 25 is performed at a factory of the supplier prior to shipment of the apparatus 80H.

Since the present invention has the arrangement that the semiconductor devices cooling module and the other portions of the refrigerant circulation system are integrated or formed into a unit that can be attached/- detached by means of the couplers, semiconductor devices cooling module and the other portions of the refrigerant circulation system can be integrally exchanged. Therefore, the operation of maintaining the semiconductor devices cooling module or the semiconductor devices incorporated therein, can easily be performed. Since there is no fear of mixture of impurities during the maintenance operation, the reliability of the apparatus can be improved.

Since the present invention has the arrangement that the outlet pipe system that establishes the connection between the semiconductor devices cooling module and the refrigerant cooling device are so constituted that the flow of the refrigerant is composed of only combination of horizontal flow and upflow, or of only upflows, the flow of the two-phase flow in the outlet refrigerant pipe can be stabilized.

A variety of embodiments where a refrigerant flow-stabilizing means comprises a module outlet-side pump disposed at a position downstream of the semiconductor devices cooling module will now be described.

Figure 15:
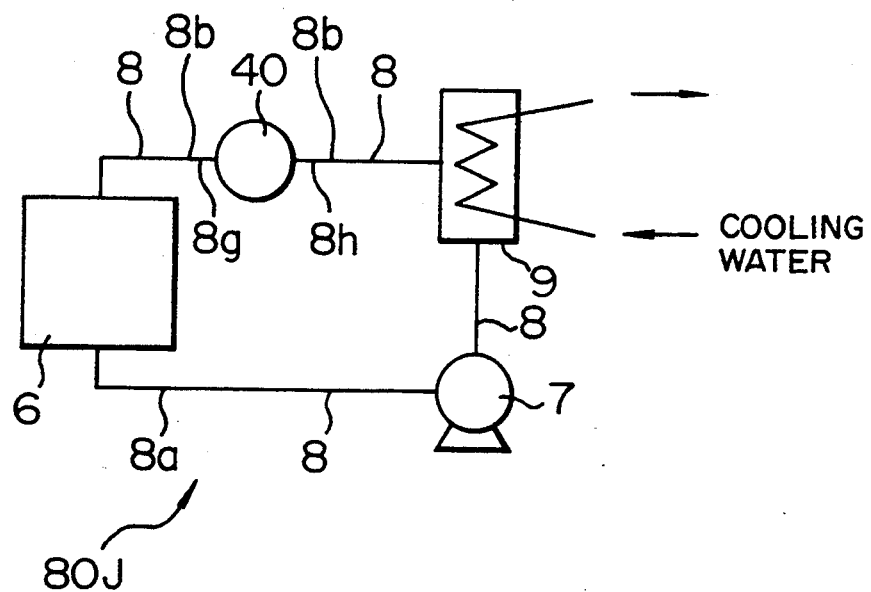
FIG. 15 is a block diagram which illustrates a basic structure of an apparatus for cooling semiconductor devices, of a type having a module outlet-side pump, i.e. a pump at a downstream or outlet-side of the modules, according to an embodiment of the present invention.

An apparatus 80J for cooling semiconductor devices according to an embodiment of the present invention will now be described with reference to FIG. 15. The semiconductor devices cooling apparatus 80J comprises the semiconductor devices cooling module 6, on which one or a plurality of heat generating semiconductor devices 29 are mounted, the pump 7 for supplying the refrigerant to the modules, the refrigerant cooling device 9, a system 8 of pipes for connecting the components and a module outlet-side pump 40 disposed in the main outlet pipe 8b at a downstream of the outlet portion of the module 6 so as to drive a gas-liquid two-phase flow of refrigerant having been discharged from the module 6 toward the refrigerant cooling device 9. Electrically non-conductive refrigerant liquid having a low boiling point and supplied to the module 6 by the refrigerant circulation pump 7 is brought into direct contact with the surface of one or the multiplicity of high heat generation density of semiconductor devices 29 mounted on the board 28 to cool the devices 29 by means of heat transfer due to the forced convention and boiling of the refrigerant fluid. The pressure of the refrigerant in the form of gas-liquid two-phase flow having been discharged from the module 6 after it has cooled the devices 29 is raised by the module outlet-side pump 40 while being enhanced its mixing to be a uniform two-phase flow that is sent to the cooling device 9 through a downstream portion 8h of the outlet pipe 8b. Cooling water is supplied from the outside to the cooling device 9 via detachable couplers although omitted from illustration. The refrigerant having been heated in the module 6 is cooled by the cooling device 9, followed by again sending the refrigerant to the module 6 by the pump 7. If the module outlet-side pump 40 is a suction-type that is able to drive the gas-liquid two-phase flow and enhance the mixing any pump can be employed.

Figure 16:
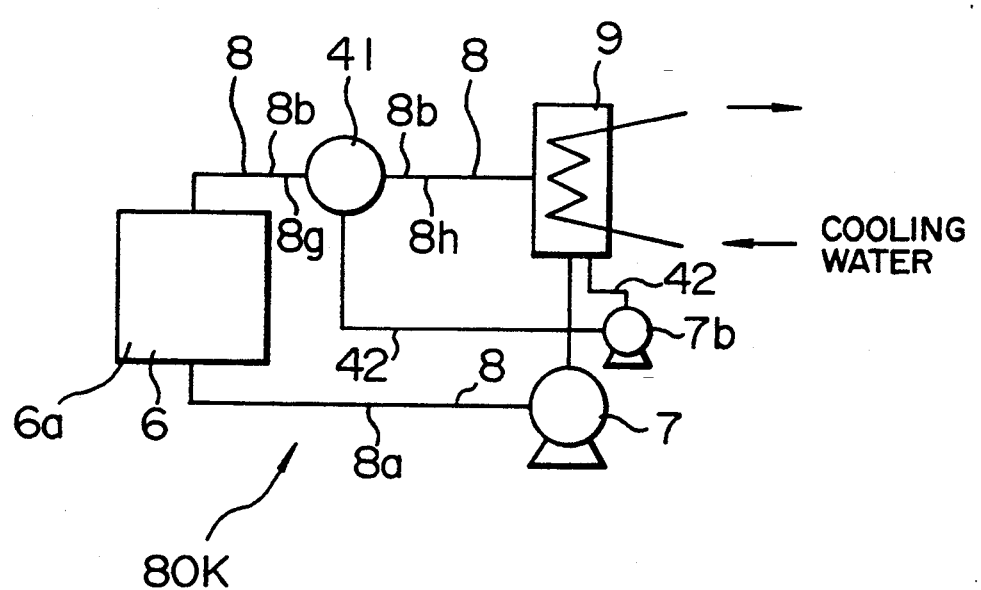
FIG. 16 is a block diagram which illustrates the structure of an apparatus for cooling semiconductor devices, of a type having a jet pump as the module outlet-side pump, according to an embodiment of the present invention.
Figure 17:
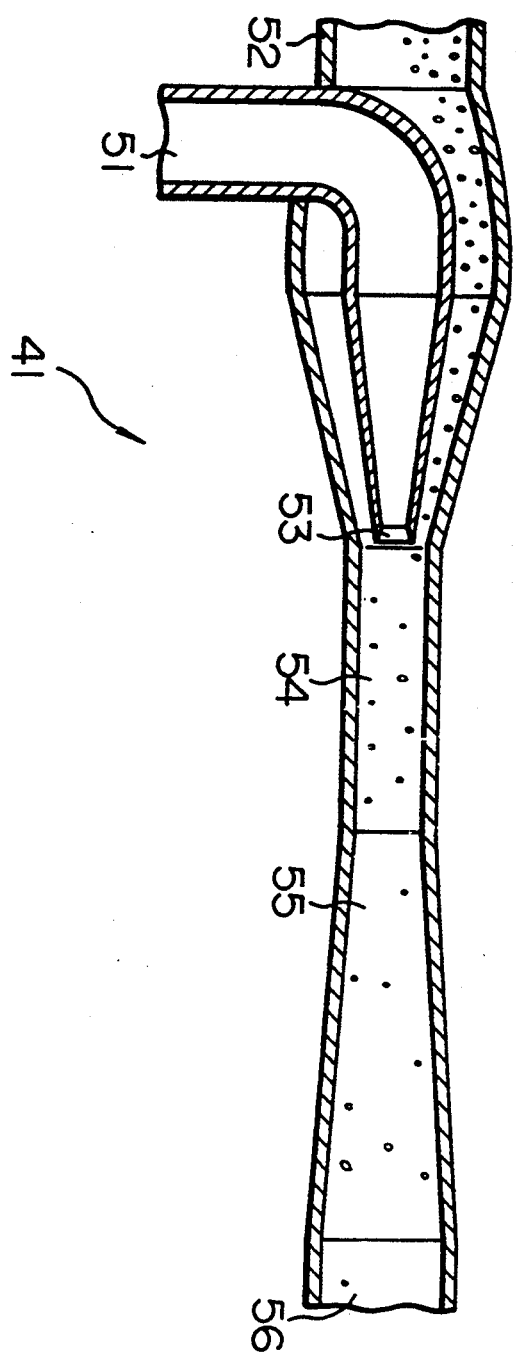
FIG. 17 is a sectional view which illustrates an example of the jet pump shown in FIG. 16.

FIG. 16 illustrates an apparatus 80K for cooling semiconductor devices according to another embodiment of the present invention and comprising a jet pump 41 as the module outlet pump 40. FIG. 17 illustrates a sectional structure of the jet pump 41 for use in this embodiment. A liquid-phase (single phase) low-temperature refrigerant serving as drive fluid is, by a drive fluid supply pump 7b, directly sent from the cooling device 9 to a high-pressure pump inlet 51 of the pump 41 via a system 42 of pipes for the drive fluid to be jetted out to a throat portion 54 through a drive-fluid jetting nozzle 53. On the other hand, the gas-liquid two-phase refrigerant having been discharged from the module 6 to an upstream portion 8g of the main outlet pipe 8b is introduced into the pump 41 through a low-pressure pump inlet 52 to be, in the throat portion 54, joined to the liquid-phase drive fluid jetted out from the nozzle 53. The single-phase drive liquid is mixed with the gas-liquid two-phase refrigerant, and accelerates the gas-liquid two-phase flow to have the same flow velocity. Then, the flow velocity of the drive liquid is lowered and the pressure of the drive liquid is raised in a widened portion 55 to drive the low-pressure refrigerant to the refrigerant cooling device 9 from a pump outlet 56 via a downstream portion 8h of the main outlet pipe 8b. The refrigerant is cooled by the cooling water in the refrigerant cooling device 9 down to a low temperature to be single phase flow, followed by return to the pump 7 and the pump 41.

Since this embodiment includes the jet pump 41 as the module outlet pump 40, the gas-liquid two-phase refrigerant can be allowed to flow without fear of cavitation. Further, the as the jet pump 41, does not have a mechanically movable portion, a possibility of the apparatus failure is low. In addition, mixing of the low-temperature liquid-phase refrigerant with the two-phase flow lowers the temperature of the two-phase flow refrigerant to promote the condensation of bubbles. Since the employment of the pump 41 according to this embodiment enhances mixing of the flows to stir bubbles liable to be concentrated in the upper portion of the pipe 8b and, accordingly, the gas-liquid two-phase flow can be made to be a bubble flow and further to be a rather single-phase-like flow according to condensation of the bubbles, the flow in the pipe 8h at the downstream of the module 6 can be made to be significantly stable and uniform.

Figure 18:
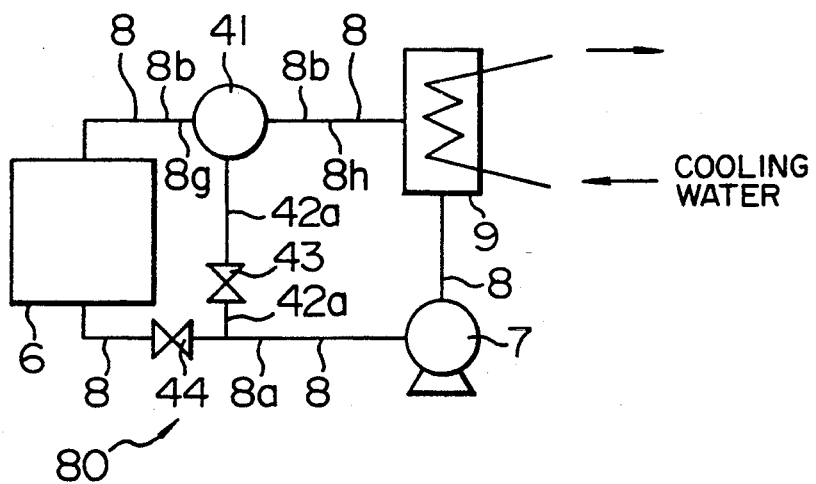
FIG. 18 is a block diagram which illustrates a structure of an apparatus for cooling semiconductor devices, of a type in which drive fluid for the jet pump is supplied through a pipe bypassed from a main pipe, according to another embodiment of the present invention.

FIG. 18 illustrates an apparatus 80L for cooling semiconductor devices according to still another embodiment of the present invention. Drive fluid for the pump 41 is supplied through a bypass pipe 42a disposed between the refrigerant circulation pump 7 and the module 6. Refrigerant pressure control valves 43 and 44 disposed near a branching portion, to the jet pump 41, between the refrigerant circulation pump 7 and the module 6 adjust or control the pressures of the refrigerant to be supplied to the jet pump 41 and the module 6. As a result, the refrigerant fluid can be supplied to the whole refrigerant circulation system without the drive-fluid supply pump 7b. Therefore, the structure of the semiconductor devices cooling apparatus 80L can be simplified.

Figure 19:
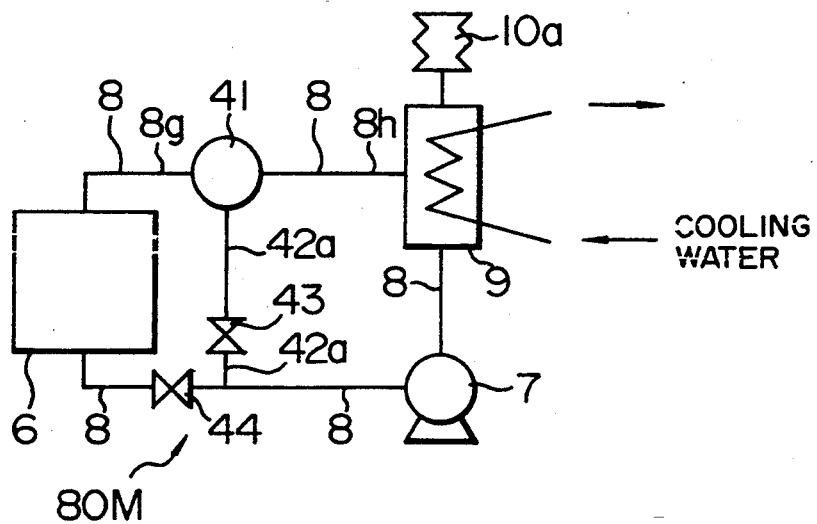
FIG. 19 is a block diagram which illustrates a structure of an apparatus for cooling semiconductor devices, comprising a refrigerant cooling device provided with a pressure-change absorbing container, according to still another embodiment of the present invention.

FIG. 19 illustrates an apparatus 80M for cooling semiconductor devices according to still another embodiment of the present invention. The apparatus 80M has, in addition to the jet pump 41, a container 10a such as a bellows container, Which is expanded/contracted in accordance with change in the pressure of the refrigerant in the refrigerant cooling device 9, as a pressure-change absorbing mechanism. As a result, the pressure change taken place in the refrigerant circulation system can be absorbed and a hydraulically stable refrigerant flow can be realized. If a rise of the temperature of the refrigerant liquid or boiling of the same has enlarged the volume of the refrigerant fluid, and if the fluid pressure in the system is raised and, there is fear that saturation temperature of the refrigerant in the vicinity of the surfaces of the heat-generating semiconductor devices 29 in the modules is raised, resulting in a non-boiling state. As a result, there is a fear that the cooling performance of the apparatus for cooling semiconductors is excessively deteriorated. However, in the apparatus 80M, the maximum volume of the container 10a is selected to be large enough to absorb the quantity of increase in the foregoing volume so that the fluid pressure in the vicinity of the container 10a can always be made to be substantially the same as the atmospheric pressure. As a result, the saturation temperature of the refrigerant fluid in the vicinity of the surfaces of the semiconductor devices 29 can be maintained at substantially the designed temperature level. The pressure-change absorbing mechanism may be a container of other types, such as container with a diaphragm and a container constituted by a piston-cylinder assembly, so long as the container is capable of absorbing the changes in the fluid pressure of the refrigerant and its increase in volume. In these cases, a similar effect to that obtainable from the foregoing bellows container can be obtained.

Figure 20:
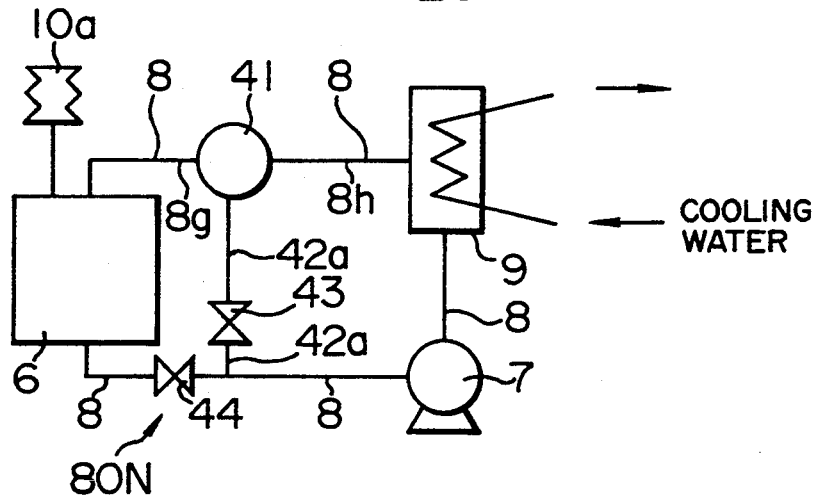
FIG. 20 is a block diagram which illustrates a structure of an apparatus for cooling semiconductor devices, comprising a semiconductor devices cooling module provided with a pressure-change absorbing container, according to still another embodiment of the present invention.

FIG. 20 illustrates an apparatus 80L for cooling semiconductor devices according to still another embodiment of the present invention, wherein a container 10a serving as the pressure-change absorbing mechanism is provided at the semiconductor devices cooling modules 6.

Figure 21:
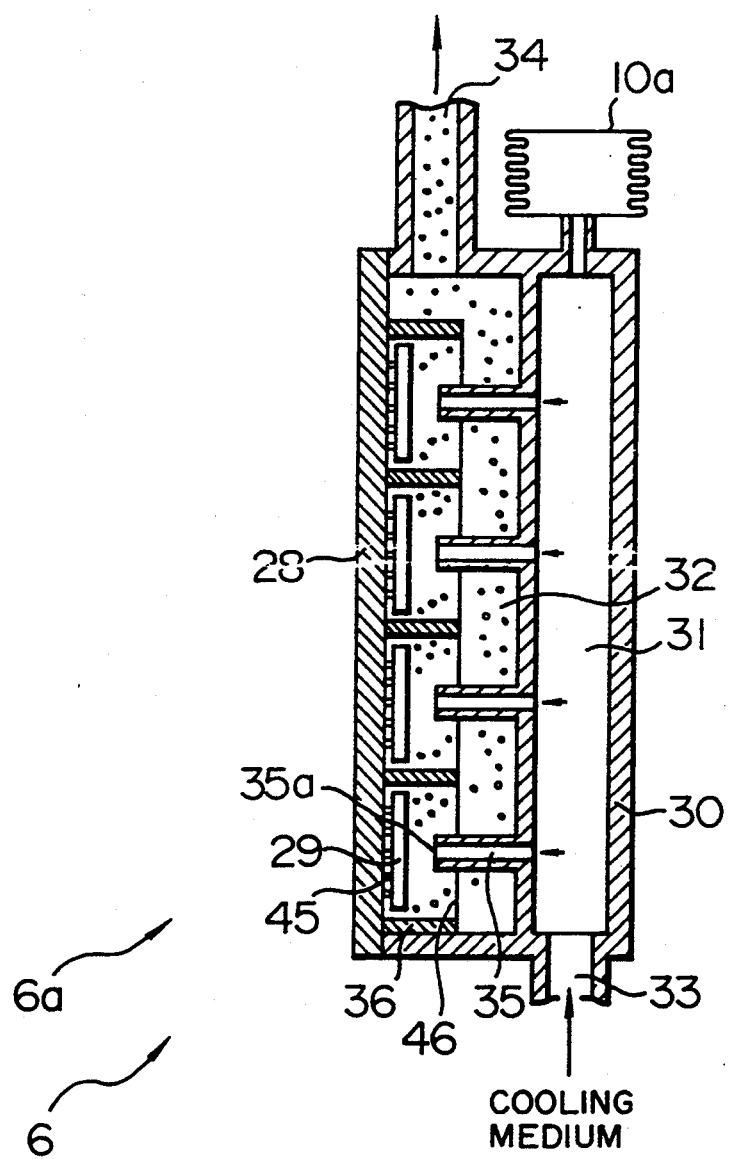
FIG. 21 is an explanatory sectional view which illustrates an example of the module shown in FIG. 20.

FIG. 21 is a sectional view of a semiconductor devices cooling modules 6a according to the embodiment of FIG. 20 where the bellows container 10a is used. The module 6a has substantially the same structure as that of the module 6 shown in FIGS. 13 and 14. Refrigerant supplied through the refrigerant supply port 33 formed in the lower end portion of the casing 30 is jetted out through the plurality of refrigerant jetting ports 35a via the refrigerant supply header 31. The board 28 has the heat-generating semiconductor devices 29 mounted thereon via electrical connection members 45. The heat-generating semiconductor devices 29 are separated by the partition members 36. The refrigerant is introduced from the refrigerant discharge opening 46 into the outlet header 32 to be collected therein, followed by discharge through the refrigerant return port 34 formed in the upper end portion of the casing 30. The container 10a connected to a portion adjacent to the refrigerant supply header 31 of the module 6a is able to absorb or relax the pressure change propagated to the module 6a via the system 8 of pipes and the refrigerant pressure change in the module 6a. Further, the combination of the container 10a with the module outlet-side pump 41 enables the refrigerant to be driven to the cooling device 9 even if the pressure of the refrigerant having been discharged from the module 6a is too low. Therefore, the internal pressure of the module 6a can be maintained at a level almost as low as the atmospheric pressure. As a result, the saturation temperature of the refrigerant in the vicinity of the heat generating semiconductor devices 29 in the module 6a can be lowered as compared with the foregoing embodiments of FIGS. 15 to 18. Therefore, boiling can be caused by a lower thermal flux so that the cooling performance is improved. Further, load repeatedly applied to the module board 28 and the like due to the pressure changes can be reduced.

Figure 22:
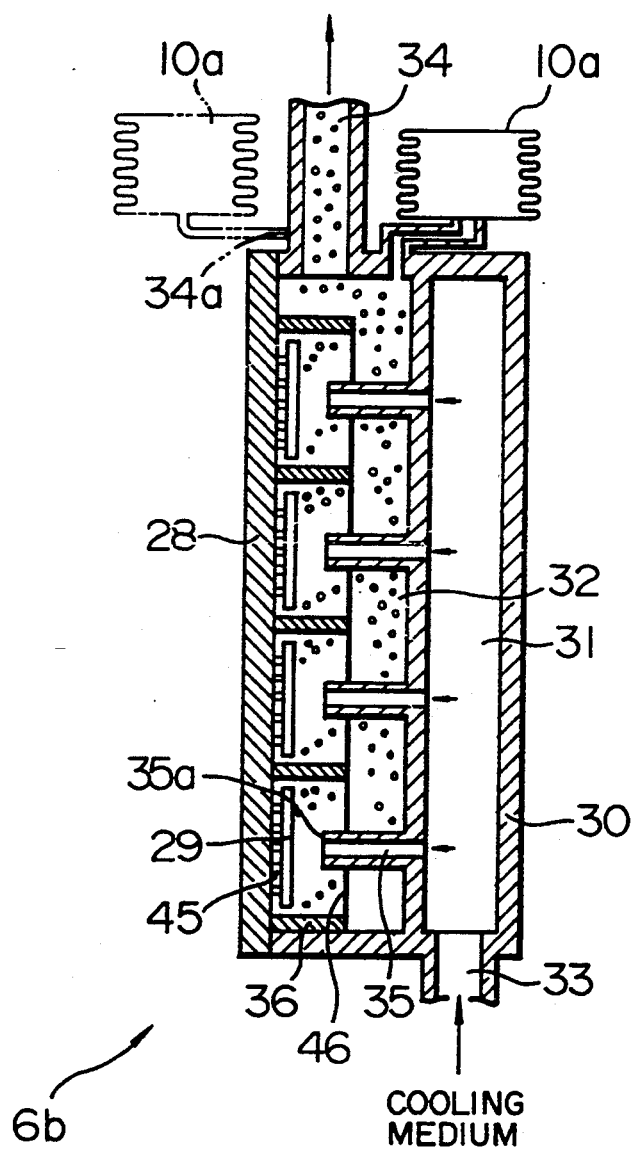
FIG. 22 is an explanatory sectional view which illustrates another example of the module shown in FIG. 20.

FIG. 22 is a sectional view which illustrates another example of semiconductor devices cooling module 6. The same reference numerals as those of FIG. 21 represent the same elements or parts. A semiconductor devices cooling module 6b is constituted by a container 10a connected to the refrigerant return header 32 so that pressure change occurring in the outlet pipe 8b of the module 6b can be absorbed before the pressure change is propagated to the semiconductor devices 29. In this respect, it is more preferable than the module 6a. The position to which the container 10a is connected may be a base portion 34a of the refrigerant return port 34 adjusted to the return or outlet header 32 as designated by imaginary lines.

Figure 23:
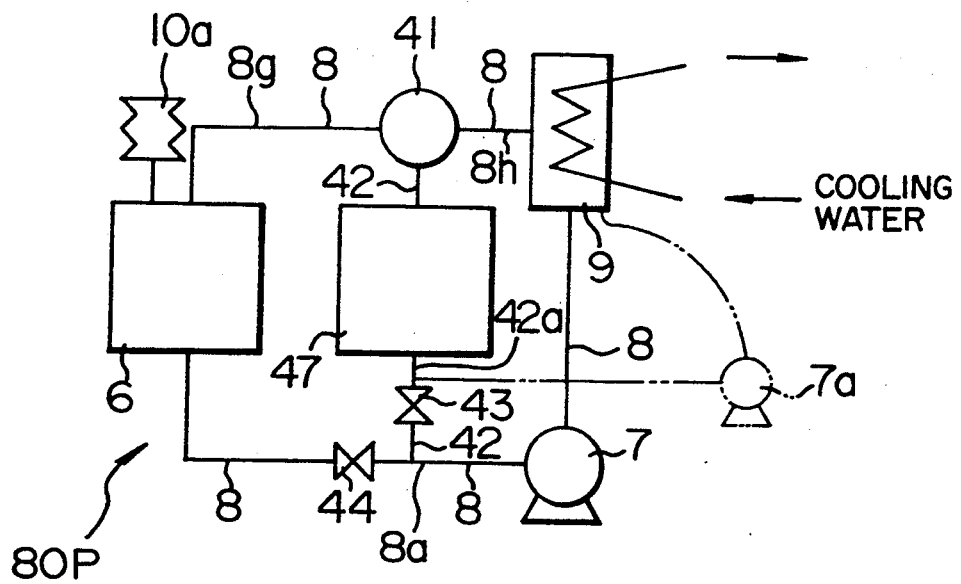
FIG. 23 is a block diagram which illustrates an apparatus for cooling semiconductor devices, where a refrigerant used to cool a low heat generation density device without being boiled is further used as drive fluid for the jet pump, according to still another embodiment of the present invention.

FIG. 23 is a block diagram which illustrates an apparatus 80P for cooling semiconductor devices according to still another embodiment of the present invention. The apparatus 80P has a low heat generation density of heating member 47, for example, semiconductor devices cooling module 47 having memory elements such as MOSICs as the devices 29 which can be sufficiently cooled by the refrigerant without boiling thereof. The refrigerant having cooled the low heating member 47 is used for driving the jet pump 41. Since the temperature of the drive fluid for the jet pump 41 is raised to a level higher in the apparatus 80P than that realized by the apparatuses of the other embodiments, the effect of condensing bubbles of the gas-liquid two-phase flow refrigerant after the mixing deteriorates. However, cooling of various semiconductor devices constituting a computer can be collectively performed in one cooling apparatus 80P. The refrigerant circulation system for the low heat generation density of heating members 47 may be made independent, as designated by an imaginary line, to be joined to the main pipe in the pump 41.

Figure 24:
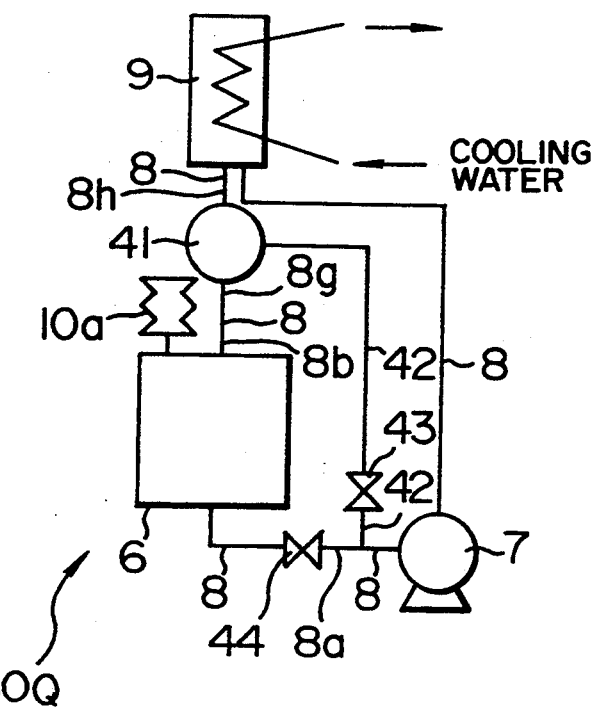
FIG. 24 is a block diagram which illustrates an apparatus for cooling semiconductor devices in which a semiconductor devices cooling module, a jet pump and a refrigerant cooling device are disposed vertically according to still another embodiment of the present invention.

FIG. 24 is a block diagram which illustrates an apparatus 80Q for cooling semiconductor devices according to still another embodiment of the present invention. The module 6, the jet pump 41 and the refrigerant cooling device 9 are disposed upward in the foregoing sequential order starting from the lowest position in the vertical direction so that the flow of the refrigerant in a state of the gas-liquid two-phase at an upstream portion 8g of the outlet pipe 8b is composed of only upflows. As a result, concentration of bubbles in the upper portion in the pipe, liable to occur in the case where the pipe is disposed horizontally, can be prevented. Hence, a refrigerant circulation system can be constituted further stably.

Figure 25:
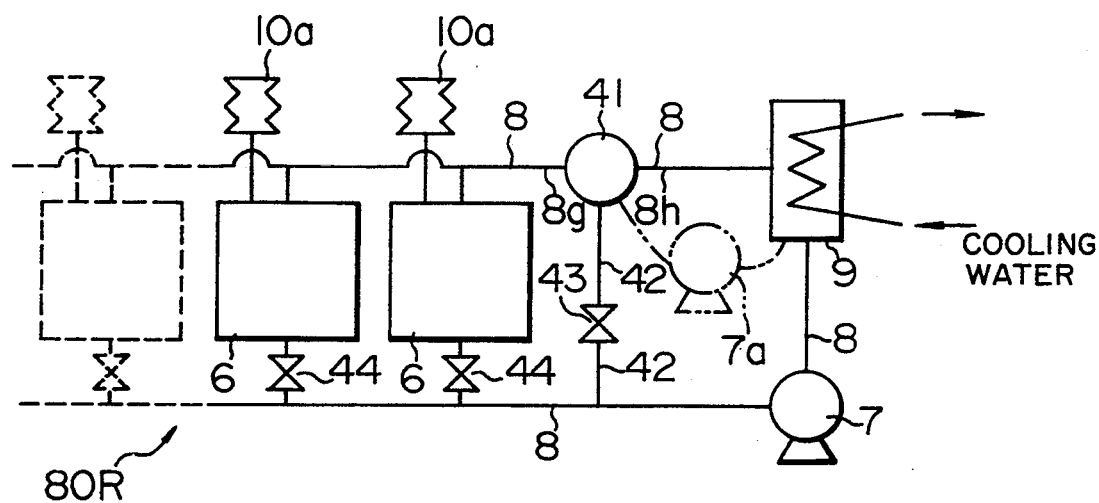
FIG. 25 is a block diagram which illustrates a structure of an apparatus for cooling semiconductor devices, having a plurality of semiconductor devices cooling modules, according to still another embodiment of the present invention.

FIG. 25 is a block diagram which illustrates an apparatus 80R for cooling semiconductor devices according to still another embodiment of the present invention. In the apparatus 80R, flows of gas-liquid two-phase refrigerants having been discharged from a plurality of modules 6 toward the refrigerant cooling device 9 are temporarily collected into one pipe element 8g, and then the refrigerant is driven by the jet pump 41 which is driven by the low-temperature single-phase refrigerant. In this case, the number of branched fluid passages for driving the jet pump 41 can be reduced to one so that the system of pipes can be simplified. A drive fluid supply pump 7a for the jet pump 41 may be independently provided as designated by imaginary lines.

Figure 26:
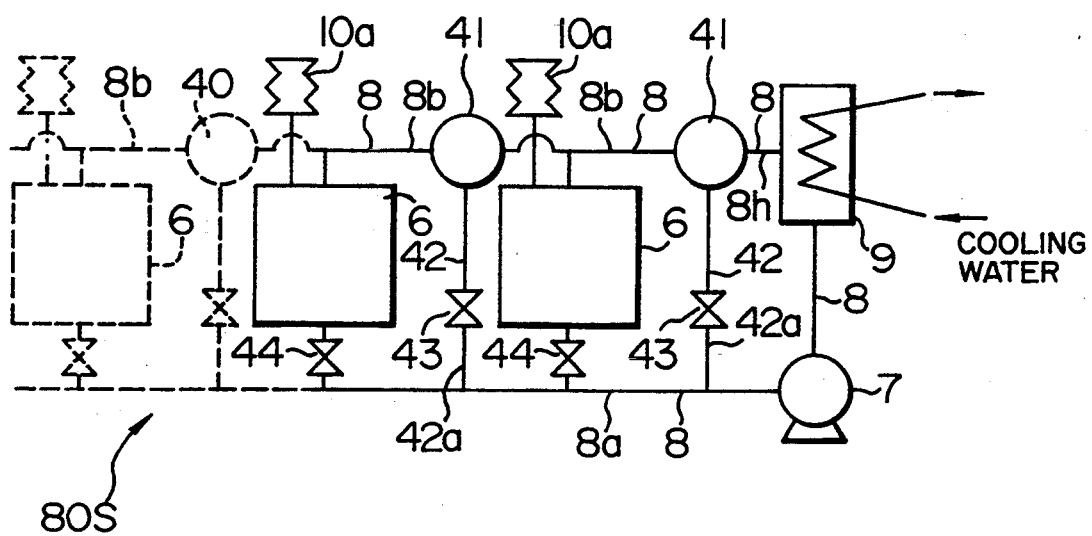
FIG. 26 is a block diagram which illustrates a structure of an apparatus for cooling semiconductor devices, having a plurality of semiconductor devices cooling modules, according to still another embodiment of the present invention.

FIG. 26 is a block diagram which illustrates an apparatus 80S for cooling semiconductor devices according to still another embodiment of the present invention. A bypass fluid passage 42a is disposed immediately before each module 6, and the jet pump 41 is disposed immediately behind each module 6, each jet pumps 41 being driven by the refrigerant that flows through the associated bypass passage 42a. By the thus arranged pumps 41, the gas-liquid two-phase refrigerant is driven immediately after having been discharged from each module 6, the gas-liquid two-phase refrigerant generated in the modules 41 is mixed with the low-temperature refrigerant immediately after the discharge from the modules 6 so that condensation of bubbles can be enhanced. Therefore, condensation of bubbles proceeds before the collection portion 8h of outlet pipes 8b through which the refrigerant returns to the refrigerant cooling device 9 so that generation of pressure change liable to occur in the gas-liquid two-phase flow at the time of the collection can be suppressed.

Figure 27:
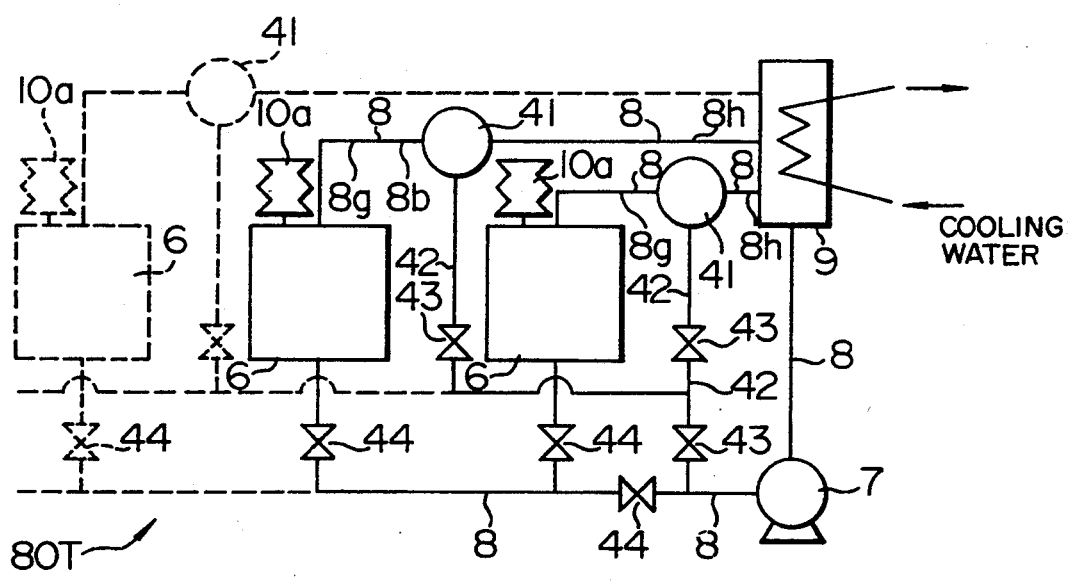
FIG. 27 is a block diagram which illustrates a structure of an apparatus for cooling semiconductor devices, having a plurality of semiconductor devices cooling modules, according to still another embodiment of the present invention.

FIG. 27 is a block diagram which illustrates an apparatus 80T for cooling semiconductor devices according to still another embodiment of the present invention. Gas-liquid two-phase refrigerant flows discharged from respective modules 6 are driven by the respective pumps 41, and the flows are not joined together but are directly supplied to the refrigerant cooling device 9. As a result, there is no fluid joined to the refrigerant discharged from each module 6 except for the respective drive fluid for the pump 41 so that generation of pressure change liable to occur due to joining of returned refrigerant flows from a plurality of the modules 6 can be prevented.

Figure 28:
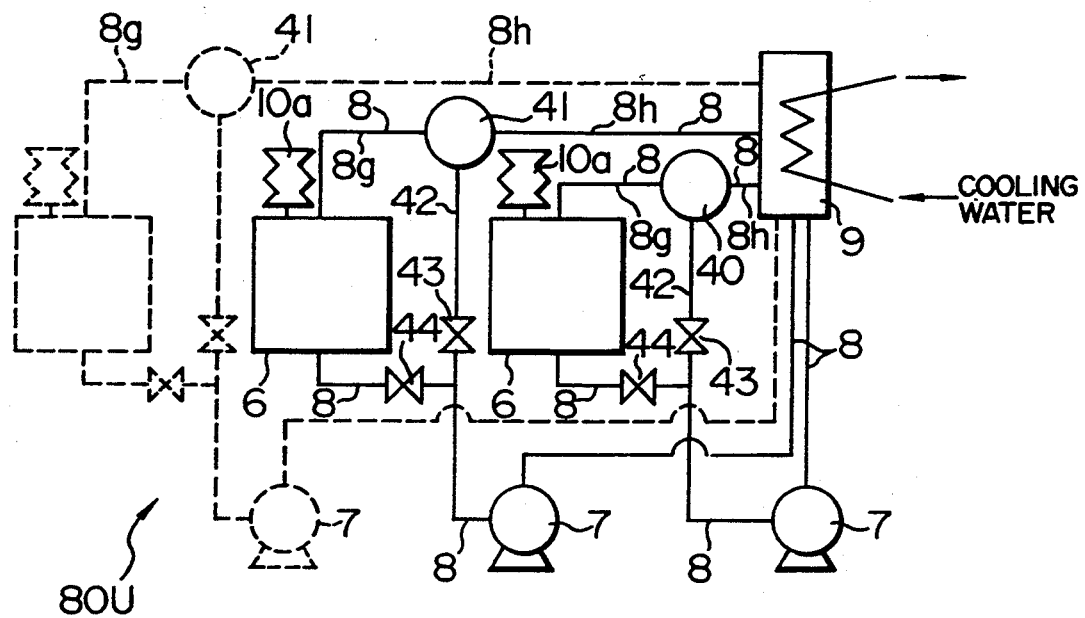
FIG. 28 is a block diagram which illustrates a structure of an apparatus for cooling semiconductor devices, including a plurality semiconductor devices cooling modules and having an arrangement where refrigerant circulation systems for the respective modules are independent except for a refrigerant cooling device, according to still another embodiment of the present invention.

FIG. 28 is a block diagram which illustrates an apparatus 80U for cooling semiconductor devices according to still another embodiment of the present invention. The semiconductor devices cooling apparatus 80U comprises independent refrigerant circulation systems for each of the modules 6 except for the refrigerant cooling device 9 that is commonly used to the refrigerant circulation systems for all modules 6. Thus, the following problems can be overcome which may be experienced in the foregoing embodiments shown in FIGS. 25 to 27 each having an arrangement that the refrigerant is supplied from one refrigerant circulation pump 7 to a plurality of the cooling modules 6 and the jet pump(s) 41: the more the number of the modules 6, a larger-capacity pump must be used and further the number of branching portions, that of the joining portions and that of the valve mechanisms increase, causing the pressure loss of the refrigerant to be enlarged. Therefore, in the apparatus 80U, the pressure loss of each system can be prevented, and the pressure change liable to occur due to joining of refrigerant flows from the modules 6 can be prevented.

Figure 29:
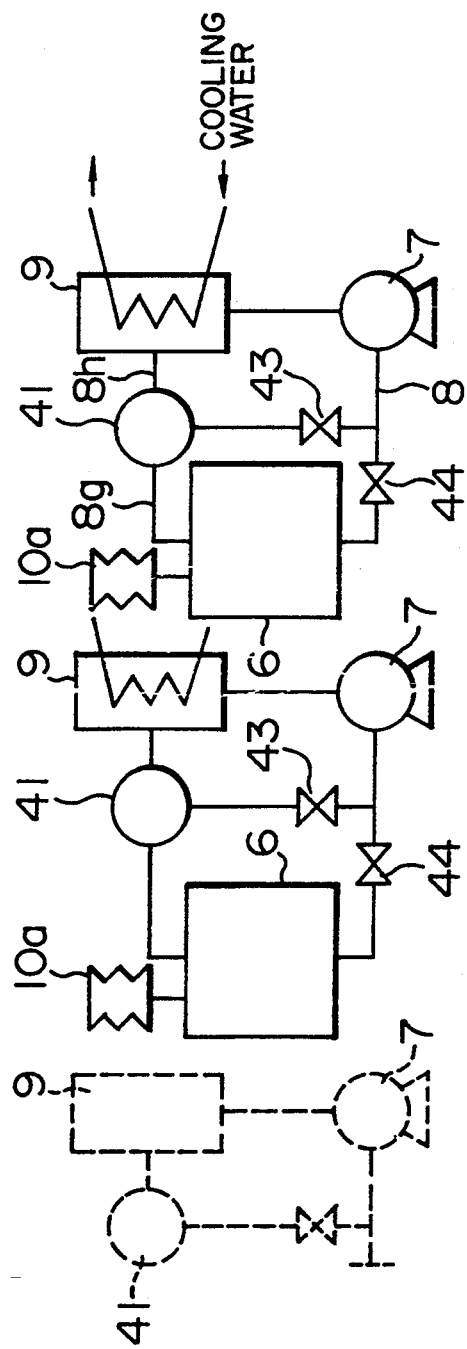
FIG. 29 is a block diagram which illustrates a structure of an apparatus for cooling semiconductor devices, including a plurality of semiconductor devices cooling modules and having an arrangement where refrigerant circulation systems for the respective modules are completely independent, according to still another embodiment of the present invention.

FIG. 29 is a block diagram which illustrates an apparatus 80V for cooling semiconductor devices according to still another embodiment of the present invention. In the apparatus 80V, one cooling system is independently provided for one cooling module 6. As a result, the cooling apparatus can be substantially designed to be adaptable to one module so that the number of the modules can be very easily exchanged after the shipment.

Figure 30:
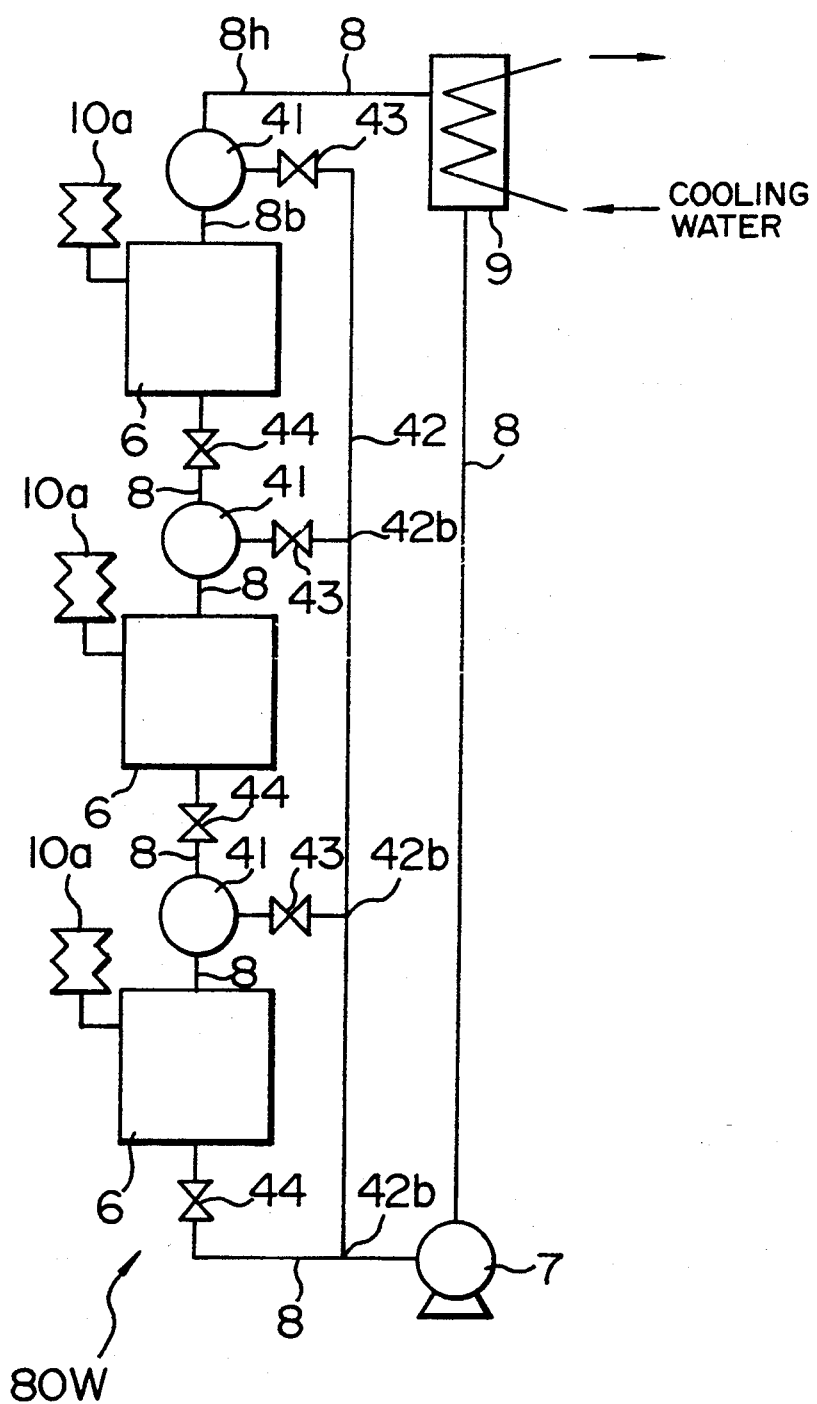
FIG. 30 is a block diagram which illustrates a structure of an apparatus for cooling semiconductor devices, including a plurality of semiconductor devices cooling modules disposed in series, according to still another embodiment of the present invention.

FIG. 30 is a diagram which illustrates an apparatus 80W for cooling semiconductor devices according to still another embodiment of the present invention. The semiconductor devices cooling apparatus 80W comprises a refrigerant circulation system having an arrangement that a plurality of the modules 6 are disposed in series and gas-liquid two-phase refrigerant flow discharged from each module 6 is driven by the jet pump 41. This apparatus 80W has no branched portion of the passages 8 and 42 except for the branching points 42b to a drive-fluid supply pipes of the jet pumps 41. Furthermore, the joints can be eliminated except in the jet pumps 41. Therefore, the following problem can be overcome which may be experienced in the embodiments shown in FIGS. 25 to 27 and having an arrangement that a plurality of the modules 6 are disposed in parallel, i.e. the problem that the number of the branching points and collecting (joining) points of the pipe elements, which may be unstable factors for the refrigerant flow, becomes larger.

Figure 31:
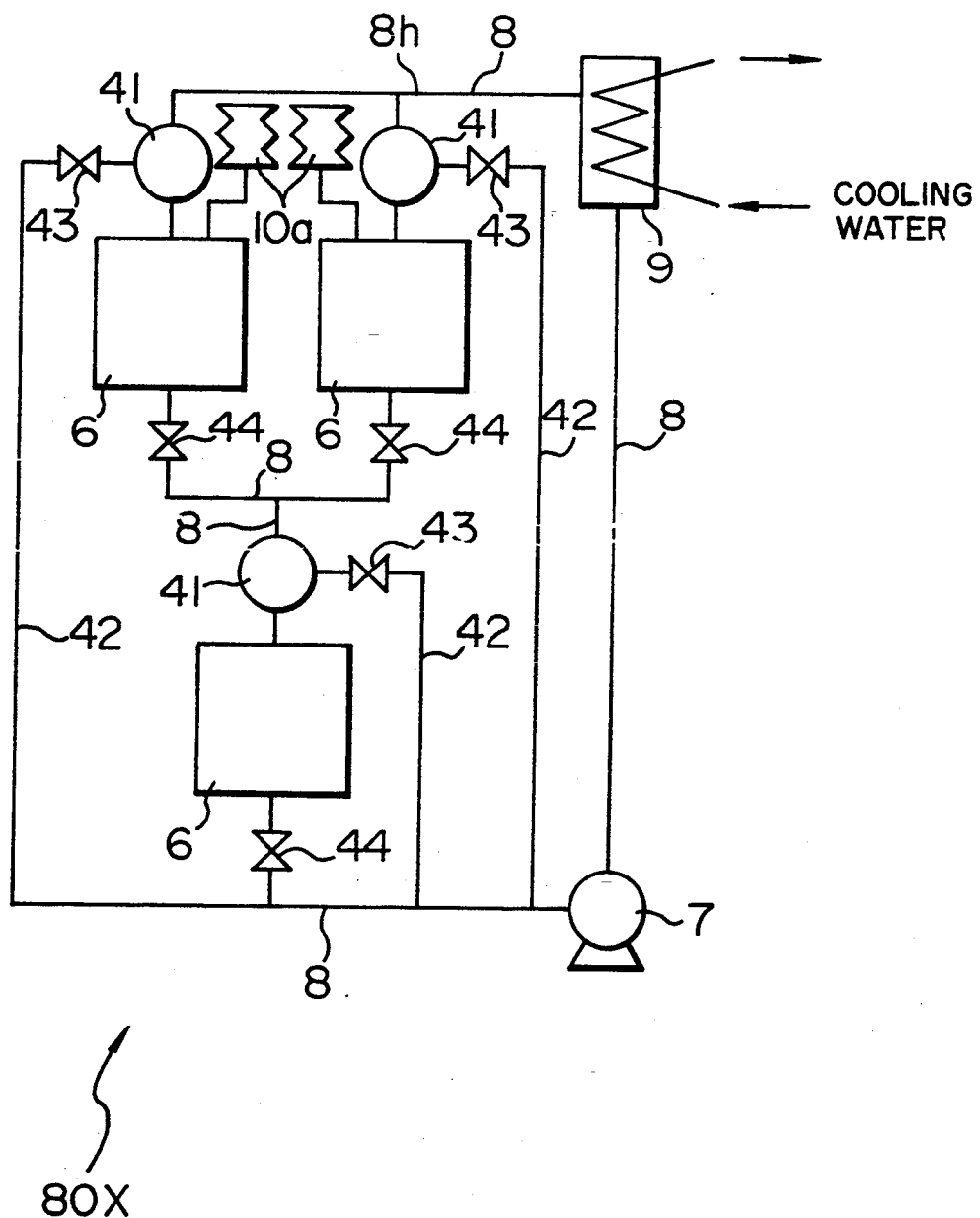
FIG. 31 is a block diagram which illustrates a structure of an apparatus for cooling semiconductor devices, including a plurality semiconductor devices cooling modules disposed by a combination of a series configuration and a parallel configuration, according to still another embodiment of the present invention.

FIG. 31 is a diagram which illustrates an apparatus 80X for cooling semiconductor devices according to still another embodiment of the present invention. In the apparatus 80X, a plurality of the modules 6 are disposed in combination of a series configuration with a parallel configuration. By compensating the refrigerant required to cool the modules 6 disposed in parallel at the downstream portion from an upstream jet pump 41, the quantity of the refrigerant to be supplied to the modules 6 can be made substantially even. Since this embodiment enables the number of branched portions within the main system 8 of pipes to be decreased as compared within the embodiments shown in FIGS. 25 to 27 in which all of the plurality of the modules 6 are disposed in parallel, thereby enabling to reduce unstable factors due to branching. Further, the following problem can be overcome which may be experienced in the arrangement shown in FIG. 30 in which all of the modules 6 are disposed in series that the flow rate of the refrigerant passing through the modules 6 at the downstream portion becomes enlarged. Therefore, the dynamic pressure of the refrigerant acting on the heat generating semiconductor devices can be lowered. Therefore, the plural modules 6 can be cooled under substantially the same condition even if the modules 6 are disposed partially in series.

According to the present invention, the arrangement that the suction-type pump 40 is disposed at an intermediate position of the outlet pipe 8b that establishes the connection between the semiconductor devices cooling modules 6 and the refrigerant cooling device 9 enhances mixing of refrigerant flows that have been formed into gas-liquid two-phase flows due to the boiling in the modules 6. As a result, the flow is made to be a uniform bubble flow in the outlet pipe 8b and, accordingly, stability of the flow can be enhanced. Therefore, the propagation of the pressure changes from the outlet pipe system 8b to the modules 6 can be minimized, and the saturation temperature of the refrigerant within the modules 6 can be maintained at substantially the predetermined level. Consequently, the cooling performance can be stabilized.

Although the invention has been described in its preferred forms with a certain degree of particularly, it should understood that the present disclosure of the preferred forms can be changed in the details of construction and the combination and arrangement of parts may be resorted to without departing from the spirit and the scope of the invention as hereinafter claimed.

We claim:

1. An apparatus for cooling semiconductor devices comprising at least one semiconductor devices cooling module for cooling semiconductor devices, said module including a container having an inlet port for a refrigerant and an outlet port for said refrigerant, a board on which a plurality of semiconductor devices are so mounted in said container as to be dipped in said refrigerant flowing from said inlet port to said outlet port in said container and to be cooled by said flow of said refrigerant which is partially boiled upon cooling the semiconductor devices and flows out from said outlet port in the form of gas-liquid two-phase flow, said board constituting a part of a wall of said container, and a cooling system for cooling said module, wherein said cooling system comprises a pump for sending said refrigerant, a refrigerant cooling device for cooling said refrigerant and thereby condense a gaseous part of said refrigerant, and a system of pipes for connecting said pump, said module and said refrigerant cooling device to circulate said refrigerant from a discharge port of said pump to said inlet port of said module, from said outlet port of said module to an inflow port for said refrigerant of said refrigerant cooling device, and from an outflow port for said refrigerant of said refrigerant cooling device to an intake port of said pump and thereby forming a closed loop, and said inflow port of in said refrigerant cooling device is disposed at a level higher than said outlet port of said module such that said refrigerant cooling device is located at a position higher than said module, and a pipe of the system of pipes connecting said outlet port of said module to said inflow port for said refrigerant of said refrigerant cooling device is arranged and configured with respect to a flow direction so as to preclude refrigerant downflow therein.

2. An apparatus for cooling semiconductor devices according to claim 1, wherein said outlet port of said module is opened at a highest position of said module.

3. An apparatus for cooling semiconductor devices according to claim 1, wherein said module has said inlet port at a lower portion thereof and said outlet port at an upper portion thereof higher than the lower portion, and said module and said refrigerant cooling device are so disposed at relative positions as to make a refrigerant flow in an outlet pipe connecting said outlet port of said module and said inflow port of said refrigerant cooling device to be composed at least one of horizontal flow and upflow.

4. An apparatus for cooling semiconductor devices according to claim 1, wherein said pump is disposed at a level lower than said refrigerant cooling device.

5. An apparatus for cooling semiconductor devices according to claim 1, further comprising a volume-variable container, an inside of which is communicated with a refrigerant passage within said refrigerant cooling device, at a top of said refrigerant cooling device.

6. An apparatus according to claim 1, wherein said refrigerant is fluorocarbon.

7. An apparatus for cooling semiconductor devices comprising:

a semiconductor devices cooling module for cooling semiconductor devices, including a container having an inlet port for a refrigerant and an outlet port for said refrigerant, and a board on which at least one semiconductor devices is so mounted in said container as to be dipped in said refrigerant flowing from said inlet port to said outlet port in said container as to be cooled by said flow of said refrigerant which is partially boiled upon cooling the semiconductor devices and flows out from said outlet port in the form of gas-liquid two-phase flow, a refrigerant cooling device adapted to receive via an outlet pipe said refrigerant discharged from said outlet port of said module so as to cool said refrigerant and thereby condense a gaseous part of said refrigerant;

a refrigerant circulation pump for receiving, via a suction pipe, said refrigerant cooled by said refrigerant cooling device and for sending said refrigerant to said module via an inlet pipe; and refrigerant-flow stabilizing means for stabilizing a refrigerant circulation flow discharged from said refrigerant circulation pump to be returned to said refrigerant circulation pump via said module and said refrigerant cooling device in which said refrigerant cooling device is located at a position higher than said module, and a pipe of the system of pipes connecting said outlet port of said module to said inflow port for said refrigerant of said refrigerant cooling device is arranged and configured with respect to a flow direction so as to preclude refrigerant downflow therein.

8. An apparatus according to claim 7, wherein said outlet port of said module is opened at a highest position of said module.

9. An apparatus according to claim 7, wherein said refrigerant is fluorocarbon.

* * * * *